United States Patent
Kato et al.

(10) Patent No.: US 11,037,785 B2
(45) Date of Patent: Jun. 15, 2021

(54) METHOD FOR FABRICATING PATTERN OF CURED PRODUCT AND METHODS FOR MANUFACTURING OPTICAL COMPONENT, CIRCUIT BOARD AND QUARTZ MOLD REPLICA AS WELL AS COATING MATERIAL FOR IMPRINT PRETREATMENT AND CURED PRODUCT THEREOF

(71) Applicant: CANON KABUSHIKI KAISHA, Tokyo (JP)

(72) Inventors: Jun Kato, Utsunomiya (JP); Toshiki Ito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/555,429

(22) Filed: Aug. 29, 2019

(65) Prior Publication Data
US 2019/0393026 A1 Dec. 26, 2019

Related U.S. Application Data

(63) Continuation of application No. PCT/JP2018/008158, filed on Mar. 2, 2018.
(Continued)

(51) Int. Cl.
*H01L 21/00* (2006.01)
*H01L 21/027* (2006.01)
(Continued)

(52) U.S. Cl.
CPC ........ *H01L 21/0273* (2013.01); *B29C 59/026* (2013.01); *B32B 27/308* (2013.01);
(Continued)

(58) Field of Classification Search
CPC . H01L 21/0273; B29C 59/026; B32B 27/308; B32B 27/38; C08F 2/48; G03F 7/0002; G03F 7/094
See application file for complete search history.

(56) References Cited

U.S. PATENT DOCUMENTS 6,696,220 B2  2/2004  Bailey et al.
6,842,229 B2  1/2005  Sreenivasan et al.
(Continued)

FOREIGN PATENT DOCUMENTS

CN  101923282 A  12/2010
JP  2009-083172 A  4/2009
(Continued)

OTHER PUBLICATIONS https://www.minichemistry.com/bond-breaking-and-bond-forming.html, 2020.*
(Continued)

*Primary Examiner* — Richard A Booth
(74) *Attorney, Agent, or Firm* — Venable LLP

(57) ABSTRACT

The method for fabricating pattern of a cured product includes a first step (arranging step) of arranging a layer formed of a liquid film of a curable composition (α1) containing at least a component (A1) serving as a polymerizable compound on a substrate and a second step (dispensing step) of dispensing liquid droplets of a curable composition (α2) containing at least a component (A2) serving as a polymerizable compound discretely onto a layer formed of a composition (α1') of components of the curable composition (α1) except a component (D1) serving as a solvent, in which: the mixing of the composition (α1') and the curable composition (α2) is exothermic.

15 Claims, 4 Drawing Sheets

Related U.S. Application Data

(60) Provisional application No. 62/468,462, filed on Mar. 8, 2017.

(51) Int. Cl.
*B29C 59/02* (2006.01)
*B32B 27/30* (2006.01)
*B32B 27/38* (2006.01)
*C08F 2/48* (2006.01)
*G03F 7/00* (2006.01)
*G03F 7/09* (2006.01)
*B82Y 10/00* (2011.01)
*B82Y 40/00* (2011.01)

(52) U.S. Cl.
CPC .............. *B32B 27/38* (2013.01); *C08F 2/48* (2013.01); *G03F 7/0002* (2013.01); *G03F 7/094* (2013.01); *B32B 2255/26* (2013.01); *B82Y 10/00* (2013.01); *B82Y 40/00* (2013.01)

(56) References Cited

U.S. PATENT DOCUMENTS

| | | | |
|---|---|---|---|
| 6,870,301 B2 | 3/2005 | Choi et al. | |
| 6,873,087 B1 | 3/2005 | Choi et al. | |
| 6,902,853 B2 | 6/2005 | Sreenivasan et al. | |
| 6,916,585 B2 | 7/2005 | Sreenivasan et al. | |
| 6,919,152 B2 | 7/2005 | Sreenivasan et al. | |
| 6,921,615 B2 | 7/2005 | Sreenivasan et al. | |
| 6,922,906 B2 | 8/2005 | Choi et al. | |
| 6,955,868 B2 | 10/2005 | Choi et al. | |
| 6,986,975 B2 | 1/2006 | Sreenivasan et al. | |
| 7,060,324 B2 | 6/2006 | Bailey et al. | |
| 7,060,402 B2 | 6/2006 | Choi et al. | |
| 7,098,572 B2 | 8/2006 | Choi et al. | |
| 7,186,483 B2 | 3/2007 | Sreenivasan et al. | |
| 7,229,273 B2 | 6/2007 | Bailey et al. | |
| 7,303,383 B1 | 12/2007 | Sreenivasan et al. | |
| 7,374,415 B2 | 5/2008 | Choi et al. | |
| 7,387,508 B2 | 6/2008 | Choi et al. | |
| 7,432,634 B2 | 10/2008 | Choi et al. | |
| 7,701,112 B2 | 4/2010 | Choi et al. | |
| 7,708,542 B2 | 5/2010 | Bailey et al. | |
| 8,033,814 B2 | 10/2011 | Bailey et al. | |
| 8,133,427 B2* | 3/2012 | Tada | G03F 7/0002 264/401 |
| 8,202,468 B2 | 6/2012 | Zhu et al. | |
| 8,206,639 B2 | 6/2012 | Zhu et al. | |
| 8,282,381 B1 | 10/2012 | Zhu et al. | |
| 8,344,065 B2 | 1/2013 | Zhu et al. | |
| 8,387,482 B2 | 3/2013 | Choi et al. | |
| 8,562,896 B2 | 10/2013 | Ishii et al. | |
| 8,574,822 B2 | 11/2013 | Zhu et al. | |
| 8,609,326 B2 | 12/2013 | Sreenivasan et al. | |
| 8,679,357 B2 | 3/2014 | Wakamatsu et al. | |
| 9,039,402 B2* | 5/2015 | Kawakami | G03F 7/0002 425/385 |
| 9,120,265 B2 | 9/2015 | Zhu et al. | |
| 9,223,202 B2 | 12/2015 | Choi et al. | |
| 9,507,263 B2 | 11/2016 | Kodama et al. | |
| 10,073,341 B2* | 9/2018 | Honma | B32B 3/30 |
| 10,113,030 B2 | 10/2018 | Kobayashi et al. | |
| 10,246,605 B2 | 4/2019 | Oomatsu et al. | |
| 2002/0094496 A1 | 7/2002 | Choi et al. | |
| 2004/0149687 A1 | 8/2004 | Choi et al. | |
| 2004/0163563 A1 | 8/2004 | Sreenivasan et al. | |
| 2005/0064344 A1 | 3/2005 | Bailey et al. | |
| 2005/0160011 A1 | 7/2005 | Sreenivasan et al. | |
| 2005/0274219 A1 | 12/2005 | Choi et al. | |
| 2005/0275311 A1 | 12/2005 | Choi et al. | |
| 2006/0005657 A1 | 1/2006 | Choi et al. | |
| 2006/0115999 A1 | 6/2006 | Sreenivasan et al. | |
| 2008/0095878 A1 | 4/2008 | Bailey et al. | |
| 2009/0011139 A1 | 1/2009 | Sreenivasan et al. | |
| 2009/0025246 A1 | 1/2009 | Choi et al. | |
| 2009/0028910 A1* | 1/2009 | DeSimone | A61K 9/0097 424/401 |
| 2009/0037004 A1 | 2/2009 | Choi et al. | |
| 2009/0214689 A1 | 8/2009 | Bailey et al. | |
| 2010/0154993 A1 | 6/2010 | Choi et al. | |
| 2011/0042345 A1 | 2/2011 | Choi et al. | |
| 2015/0028524 A1 | 1/2015 | Kobayashi et al. | |
| 2017/0066208 A1 | 3/2017 | Khusnatdinov et al. | |
| 2017/0068159 A1 | 3/2017 | Khusnatdinov et al. | |
| 2017/0068161 A1 | 3/2017 | Stachowiak et al. | |
| 2017/0235221 A1* | 8/2017 | Nagai | B29C 59/026 264/40.1 |
| 2017/0283620 A1 | 10/2017 | Otani et al. | |
| 2017/0283632 A1 | 10/2017 | Chiba et al. | |
| 2017/0285462 A1 | 10/2017 | Ito | |
| 2017/0285463 A1 | 10/2017 | Ito et al. | |
| 2017/0285464 A1 | 10/2017 | Ito et al. | |
| 2017/0285465 A1 | 10/2017 | Iimura et al. | |
| 2017/0285466 A1 | 10/2017 | Chiba et al. | |
| 2018/0272634 A1 | 9/2018 | Khusnatdinov et al. | |
| 2018/0275511 A1 | 9/2018 | Stachowiak et al. | |
| 2019/0023842 A1 | 1/2019 | Kobayashi et al. | |
| 2019/0030785 A1 | 1/2019 | Kato et al. | |
| 2019/0377260 A1 | 12/2019 | Otani et al. | |
| 2019/0391483 A1 | 12/2019 | Ito et al. | |
| 2019/0391484 A1 | 12/2019 | Chiba et al. | |

FOREIGN PATENT DOCUMENTS

| | | |
|---|---|---|
| JP | 2010-073811 A | 4/2010 |
| JP | 2010-080632 A | 4/2010 |
| JP | 2010-87528 A | 4/2010 |
| JP | 2010-258182 A | 11/2010 |
| JP | 2012-69762 A | 4/2012 |
| JP | 2013-56440 A | 3/2013 |
| JP | 2013-93552 A | 5/2013 |
| JP | 2015-26740 A | 2/2015 |
| JP | 2016-28419 A | 2/2016 |
| JP | 2017-55108 A | 3/2017 |
| WO | 2016/031879 A1 | 3/2016 |
| WO | 2018/051961 A1 | 3/2018 |
| WO | 2018/163995 A1 | 9/2018 |
| WO | 2018/164015 A1 | 9/2018 |
| WO | 2018/164016 A1 | 9/2018 |
| WO | 2018/164017 A1 | 9/2018 |

OTHER PUBLICATIONS

International Search Report in International Application No. PCT/JP2018/008158 (dated May 15, 2018).
Article 19 Amendment in International Application No. PCT/JP2018/008158 (dated Jul. 12, 2018).
Informal Comments in International Application No. PCT/JP2018/008158 (Jul. 12, 2018).
Shravanthi Reddy et al., "Simulation of Fluid Flow in the Step and Flash Imprint Lithography Process," 82 Microelectron, Eng. 60-70 (Jul. 2005).
Nobuyuki Imaishi, "Fundamental of the Marangoni Convection," Int. J. Microgravity Sci. No. 31 Supplement, pp. S5-S12 (2014).
International Preliminary Report on Patentability in International Application No. PCT/JP2018/008158 (dated Sep. 2019).
Notice of Preliminary Rejection in Korean Application No. 10-2019-7028418 (dated Aug. 2020).
Chiba et al., U.S. Appl. No. 16/556,836, filed Aug. 30, 2019.
Ito et al., U.S. Appl. No. 16/552,815, filed Aug. 27, 2019.
Otani et al., U.S. Appl. No. 16/548,371, filed Aug. 22, 2019.
U.S. Appl. No. 16/556,836, WO 2018/163995.
U.S. Appl. No. 16/552,815, WO 2018/164016.
U.S. Appl. No. 16/548,371, WO 2018/164015.
Office Action in Taiwanese Application No. 107107657 (dated Nov. 2018).

* cited by examiner

METHOD FOR FABRICATING PATTERN OF CURED PRODUCT AND METHODS FOR MANUFACTURING OPTICAL COMPONENT, CIRCUIT BOARD AND QUARTZ MOLD REPLICA AS WELL AS COATING MATERIAL FOR IMPRINT PRETREATMENT AND CURED PRODUCT THEREOF

CROSS-REFERENCE TO RELATED APPLICATIONS

This application is a Continuation of International Patent Application No. PCT/JP2018/008158, filed Mar. 2, 2018, which claims the benefit of U.S. Provisional Patent Application No. 62/468,462, filed Mar. 8, 2017, both of which are hereby incorporated by reference herein in their entirety.

BACKGROUND OF THE INVENTION

Field of the Invention

The present invention relates to a method for fabricating pattern of a cured product, methods for manufacturing an optical component, a circuit board, and a quartz mold replica, and a coating material for imprint pretreatment and a cured product thereof.

There has been a growing requirement for miniaturization in a semiconductor device, a MEMS, or the like. In particular, a photo-nanoimprint technology has been attracting attention. In the photo-nanoimprint technology, a resist is cured in a state in which a mold having a fine groove/land pattern formed on its surface is pressed against a substrate (wafer) having applied thereto the photocurable composition (resist). Thus, the groove/land pattern of the mold is transferred onto the cured product of the resist and hence the pattern is formed on the substrate. According to the photo-nanoimprint technology, a fine structural body of the order of several nanometers can be formed on the substrate.

In the photo-nanoimprint technology, first, the resist is applied to a pattern forming area on the substrate (arranging step). Next, the resist is molded with the mold having formed thereon the pattern (mold contacting step). Then, the resist is irradiated with light to be cured (light irradiating step), and then the mold is released (releasing step). The performance of those steps results in the formation of a resin pattern (photocured product) having a predetermined shape on the substrate. Further, the repetition of all of the steps at any other position on the substrate can result in the formation of a fine structural body over the entirety of the substrate.

A method for fabricating pattern by a photo-nanoimprint technology disclosed in Japanese Patent Application Laid-Open No. 2010-073811 is described with reference to a schematic sectional view of FIG. 1. First, a liquid curable composition (resist) 102 is dispensed dropwise discretely onto a pattern forming area on a substrate 101 by using an inkjet method (arranging step (1), FIG. 1(a) to FIG. 1(c)). The liquid droplets of the curable composition 102 dispensed dropwise spread on the substrate 101 as indicated by arrows 104 each indicating the direction in which a liquid droplet spreads (FIG. 1(c)), and the phenomenon is called prespread. Next, the curable composition 102 is molded with a mold 105 having formed thereon a pattern, the mold being transparent to irradiation light 106 to be described later (mold contacting step (2), FIG. 1(d) and expanded part thereof). In the mold contacting step, the liquid droplets of the curable composition 102 spread over the entire area of a gap between the substrate 101 and the mold 105 as indicated by the arrows 104 showing the direction in which droplets spread (FIG. 1(d) and expanded part thereof). The phenomenon is called spread. In addition, in the mold contacting step, the curable composition 102 is filled into groove portions on the mold 105 by virtue of the capillary phenomenon as indicated by the arrows 104 each indicating the direction in which a liquid droplet spreads (expanded part of FIG. 1(d)). The filling phenomenon is called fill. A time required for the spread and the fill to be completed is called a filling time. After the filling of the curable composition 102 has been completed, the curable composition 102 is irradiated with the irradiation light 106 to be cured (light irradiating step (3), FIG. 1(e)), and then the mold 105 is released from the substrate 101 (releasing step (4), FIG. 1(f)). When those steps are sequentially performed, a pattern of the cured curable composition 102 having a predetermined shape (photocured film 107, FIG. 1(f) and expanded part thereof) is formed on the substrate 101. A residual film 108 may remain in a groove portion of the resist pattern corresponding to a land portion of the mold 105 (expanded part of FIG. 1(f)).

The photo-nanoimprint technology disclosed in Japanese Patent Application Laid-Open No. 2010-073811 has involved a problem in that a time period (filling time) from the initiation of the contact of the mold to the completion of the spread and the fill is long, and hence throughput is generally low.

In view of the foregoing, the inventors of the present invention have devised a photo-nanoimprint technology having a short filling time, in other words, high throughput (short spread time nanoimprint lithography, hereinafter referred to as "SST-NIL"). As illustrated in the schematic sectional views of FIG. 2, the SST-NIL is a technology obtains a cured film having a pattern shape and includes:

an arranging step (1) of arranging a liquid film of a curable composition ($\alpha$1) 202 on a substrate 201;

a dispensing step (2) of dispensing liquid droplets of a curable composition ($\alpha$2) 203 discretely onto a layer formed of the liquid film of the curable composition ($\alpha$1) 202;

a mold contacting step (3) of bringing a mixture layer obtained by partially mixing the curable composition ($\alpha$1) 202 and the curable composition ($\alpha$2) 203 into contact with a mold 205;

a light irradiating step (4) of curing the mixture layer obtained by mixing the curable composition ($\alpha$1) 202 and the curable composition ($\alpha$2) 203 with irradiation light 206; and a releasing step (5) of releasing the mold 205 from the mixture layer after the curing.

In the SST-NIL, a series of step units ranging from the dispensing step (2) to the releasing step (5) is referred to as "shot", and an area where the mold 205 is in contact with the curable composition ($\alpha$1) 202 and the curable composition ($\alpha$2) 203, in other words, an area where a pattern is formed on the substrate 201 is referred to as "shot area".

In the SST-NIL, the liquid droplets of the curable composition ($\alpha$2) 203 dispensed dropwise discretely expand quickly on the liquid film of the curable composition ($\alpha$1) 202 as indicated by arrows 204 each indicating the direction in which a liquid droplet spreads, and hence a filling time is short and throughput is high.

However, the SST-NIL illustrated in FIG. 2 involves the following problem. That is, the curable composition ($\alpha$1) 202 is arranged on the substrate 201 by using, for example, spin coating so as to occupy an area wider than a shot area, such as the entire surface of the substrate (FIG. 2(b)).

Meanwhile, the curable composition (α2) 203 is dispensed discretely by using, for example, an inkjet method. Here, the curable composition (α1) 202 and the curable composition (α2) 203 are different compositions, and after the curable composition (α2) 203 has been dispensed dropwise, both the compositions are mixed by the time the light irradiating step (4) begins. When the mixing of the curable composition (α1) 202 and the curable composition (α2) 203 is insufficient, the composition of the mixture does not become uniform and hence the nonuniformity of film physical properties occurs. When irradiation light 206 is irradiated to an area 209 and a mixture 208 to be cured (FIG. 2(*f*)) in a state that the area 209 where the mixing of the composition of the mixture is insufficient and the mixture 208 in which the mixing of the curable composition (α1) 202 and the curable composition (α2) 203 is insufficient (FIG. 2(*e*)), a problem in that the film physical properties of a film obtained by the curing, such as dry etching resistance, become nonuniform occurs.

The curable composition (α1) 202 and the curable composition (α2) 203 are mixed in a period from the dispensing step (2) to the beginning of the light irradiating step (4) to form the mixture 208 of the curable composition (α1) 202 and the curable composition (α2) 203. In general, there is often a difference in dry etching resistance between the curable composition (α1) 202 and the curable composition (α2) 203. For example, when the dry etching resistance of the curable composition (α1) 202 is lower than that of the curable composition (α2) 203, a cured film in the area 209 where the compositions are not sufficiently cured has low dry etching resistance. The area having low dry etching resistance serves as a defect at the time of etching in a residual film removing step that is a subsequent step. In order to avoid such defect as described in the foregoing, the curable compositions need to be sufficiently mixed. In order to diffuse the curable composition (α2) 203 into the curable composition (α1) 202, the curable composition (α1) 202 and the curable composition (α2) 203 need to be brought into contact with each other for a long time period. However, when a long time period is taken for the mixing, a time period for one shot lengthens and hence a problem in that throughput remarkably reduces occurs.

In view of the foregoing, an object of the present invention is to provide a method for fabricating pattern of a cured product having uniform physical properties in a shot area of a substrate at high throughput.

SUMMARY OF THE INVENTION

In order to solve the above-mentioned problem, according to the present invention, there is provided a method for fabricating pattern of a cured product, including:

(1) a first step (arranging step) of arranging a layer formed of a liquid film of a curable composition (α1) containing at least a component (A1) serving as a polymerizable compound on a substrate;

(2) a second step (dispensing step) of dispensing liquid droplets of a curable composition (α2) containing at least a component (A2) serving as a polymerizable compound discretely onto a layer formed of a liquid film of a composition (α1') of components except a component (D1) serving as a solvent;

(3) a third step (mold contacting step) of bringing a mixture layer obtained by mixing the composition (α1') and the curable composition (α2) into contact with a mold;

(4) a fourth step (light irradiating step) of irradiating the mixture layer with light from a side of the mold to cure the layer; and (5) a fifth step (releasing step) of releasing the mold from the mixture layer after the curing, in which mixing of the composition (α1') and the curable composition (α2) dispensed in the second step is exothermic.

According to another embodiment of the present invention, there is provided a coating material for imprint pretreatment, including a curable composition (α1) containing at least a component (A1) serving as a polymerizable compound, in which:

when a liquid film consisting of the coating material for imprint pretreatment is formed on a substrate and a liquid droplet formed of a curable composition (α2) containing at least a component (A2) serving as a polymerizable compound is dispensed to the liquid film, spread of a component of the liquid droplet in a substrate surface direction is accelerated; and in the curable composition (α1), mixing of a composition (α1') of components of the curable composition (α1) except a component (D1) serving as a solvent and the curable composition (α2) dispensed in the second step is exothermic.

Further features of the present invention will become apparent from the following description of exemplary embodiments with reference to the attached drawings.

DESCRIPTION OF THE EMBODIMENTS

[Curable Composition]

Figure 1:
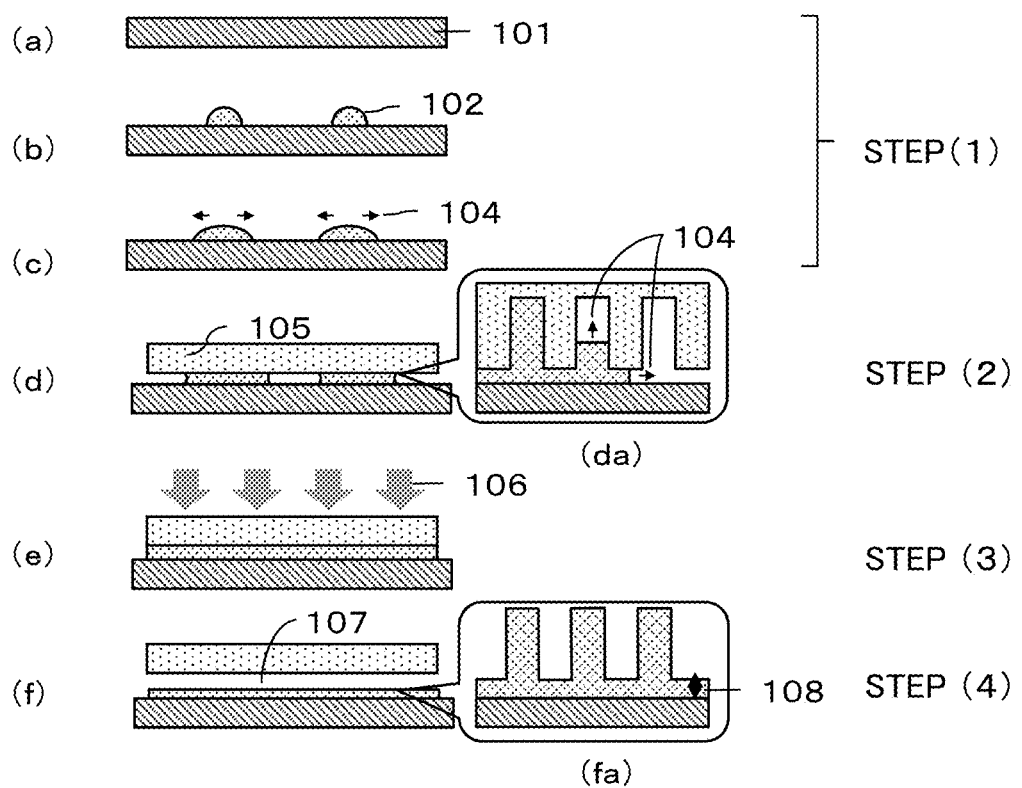
FIG. 1 is schematic sectional view for illustrating a precedent for a photo-nanoimprint technology.

A method for fabricating pattern of the present invention uses at least a curable composition (α1) and a curable composition (α2) (hereinafter, both are also referred to as "curable composition (α)"). The curable composition (α1) is configured to accelerate, by forming a liquid film serving as an imprint pretreatment coating on a substrate, the spread of a liquid droplet component in a substrate surface direction when the liquid droplet consisting of the curable composition (α2) is dispensed to the liquid film of a composition (α1') of the components of the curable composition (α1) except a component (D1) serving as a solvent.

The curable composition (α1) has features in that: the mixing of a composition (α1') of components of the curable composition (α1) except the component (D1) serving as the solvent and a liquid droplet to be dispensed, i.e., a curable composition (α2) to be dispensed onto a liquid film thereof is exothermic; and the surface tension of the composition (α1') of the components of the curable composition (α1) except the component (D1) serving as a solvent is larger than the surface tension of the curable composition (α2).

Here, the phrase "the mixing of the composition (α1') of the components of the curable composition (α1) except the component (D1) serving as a solvent and the curable composition (α2) is exothermic" means that when the composition (α1') of the components of the curable composition (α1) except the component (D1) serving as a solvent and the curable composition (α2) are stirred and mixed at 1:1 (weight ratio) under, for example, an environment at 25° C., the temperature of a composition obtained by mixing both the curable compositions increases. When the composition (α1') of the components of the curable composition (α1) except the component (D1) serving as a solvent and the curable composition (α2) whose mixing is exothermic as described above are used, an increase in viscosity resulting from a reduction in temperature when the curable composition (α2) is dispensed dropwise and mixed onto the composition (α1') of the components of the curable composition (α1) except the component (D1) serving as a solvent is prevented and hence the mixing of the composition (α1') of the components of the curable composition (α1) except the component (D1) serving as a solvent and the curable composition (α2) is accelerated. Accordingly, there can be provided a pattern forming method by which a pattern having uniform physical properties in a shot area of a substrate can be formed at high throughput.

In addition, the temperature increase is preferably 6° C. or less, more preferably 5° C. or less, still more preferably 4° C. or less. When the temperature increase is suppressed to 6° C. or less, a side reaction except a curing reaction at a curable composition-mold interface is suppressed. In order to obtain sufficient effect of the present invention, the temperature preferably increases by 0.5° C. or more.

When a temperature change at the time of the mixing is so small as to be difficult to measure, it is preferred that a heat generation quantity or a heat absorption quantity at the time of the mixing be measured with a thermal analyzer, such as a differential thermal analyzer (DTA), a thermal gravimetric-differential thermal analyzer (TG-DTA), or a differential scanning calorimeter (DSC), and the heat generation quantity and the heat absorption quantity be caused to correspond to a temperature increase and a temperature reduction, respectively.

For one example of the evaluation of the temperature increase, the temperature of the composition that the composition (α1') of the components of the curable composition (α1) except the component (D1) serving as a solvent and the curable composition (α2) is measured at the time of the mixing of the composition (α1') of the components of the curable composition (α1) except the solvent component (D1) and the curable composition (α2) in 1:1 (weight ratio), hence the presence or absence of the temperature increase at mixing can be evaluated. The temperature increase can be evaluated under, for example, an environment at 25° C.

For another example of the evaluation of the temperature increase, when a temperature change at the time of the mixing is so small as to be difficult to measure, the temperature increase can be evaluated with a thermal analyzer, such as a differential thermal analyzer (DTA), a thermal gravimetric-differential thermal analyzer (TG-DTA), or a differential scanning calorimeter (DSC). For example, a heat generation quantity or a heat absorption quantity at the time of the mixing of the composition (α1') of the components of the curable composition (α1) except the solvent component (D1) and the curable composition (α2) at 1:1 (weight ratio) can be measured with a thermal analyzer. The temperature increase can be evaluated under, for example, an environment at room temperature.

Further, it is preferred that the composition (α1') of the components of the curable composition (α1) except the component (D1) serving as a solvent and the curable composition (α2) be quickly mixed, and for example, when the composition (α1') of the components of the curable composition (α1) except the component (D1) serving as a solvent and the curable composition (α2) are mixed at 25° C. under a stationary state, the compositions are preferably mixed within 5 seconds, are more preferably mixed within 2 seconds, and are still more preferably mixed within 1 second.

In addition, the term "cured product" as used herein refers to a product obtained by polymerizing a polymerizable compound in a composition, such as a curable composition, to partially or entirely cure the composition. When emphasis is placed on the fact that the thickness of a cured product is extremely small as compared to its area, the cured product is particularly referred to as "cured film" in some cases. In addition, when emphasis is placed on the fact that cured films are stacked in a laminar fashion, the resultant is particularly referred to as "cured layer" in some cases. The shapes of such "cured product", "cured film", and "cured layer" are not particularly limited, and the cured product, the cured film, and the cured layer may have pattern shapes on their surfaces. Each component according to the present invention is described in detail below.

(Curable Compositions (α))

In the present invention, curable compositions (α), i.e., the curable composition (α1) and the curable composition (α2) are each a compound containing at least a component (A) serving as a polymerizable compound. In the present invention, the curable compositions (α) may each further contain a component (B) serving as a photopolymerization initiator, a component (C) serving as a nonpolymerizable compound, or the component (D1) serving as a solvent. However, the curable compositions (α) are not limited thereto as long as the compositions are cured by light irradiation. For example, the curable compositions (α) may each contain a compound having, in one and the same molecule thereof, reactive functional groups serving as the component (A) and the component (B). The components comprised in the curable compositions (α1) are represented by the component (A1) to (D1), and the components comprised in the curable compositions (α2) are represented by the component (A2) to (D2). The respective components of the curable compositions (α) are described in detail below.

<Component (A): Polymerizable Compound>

The component (A) is a polymerizable compound. Here, the polymerizable compound in the present invention is a compound that reacts with a polymerization factor (such as a radical) generated from the component (B) serving as the photopolymerization initiator to be polymerized by a chain reaction (polymerization reaction). The polymerizable compound is preferably a compound that forms a cured product formed of a polymer compound by virtue of the chain reaction.

In the present invention, it is preferred that all polymerizable compounds in each of the curable compositions (α) be collectively defined as the component (A). This case includes: a construction in which the number of kinds of polymerizable compounds in each of the curable compositions (α) is only one; and a construction in which the curable composition contains only a specific plurality of kinds of polymerizable compounds.

As such polymerizable compound, there is given, for example, a radical polymerizable compound. From the viewpoints of a polymerization rate, a curing rate, and a reduction in process time or the like, it is more preferred that the polymerizable compound according to the present invention be the radical polymerizable compound. It is preferred that the radical polymerizable compound be a compound having one or more acryloyl groups or methacryloyl groups, that is, a (meth)acrylic compound.

Therefore, in the present invention, a (meth)acrylic compound is preferably incorporated as the component (A) of each of the curable compositions (α). In addition, the main component of the component (A) is more preferably a (meth)acrylic compound. Further, all polymerizable compounds in each of the curable compositions (α) are most preferably (meth)acrylic compounds. The phase "the main component of the component (A) is a (meth)acrylic compound" as used herein means that the (meth)acrylic compound accounts for 90 wt % or more of the component (A).

When the radical polymerizable compound is formed of a plurality of kinds of (meth)acrylic compounds, the compound preferably contains a monofunctional (meth)acrylic monomer and a multifunctional (meth)acrylic monomer. This is because the combination of the monofunctional (meth)acrylic monomer and the multifunctional (meth)acrylic monomer provides a cured product having a high mechanical strength.

Monofunctional (meth)acrylic compounds each having one acryloyl group or methacryloyl group are exemplified by, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, 1-naphthylmethyl (meth)acrylate, 2-naphthylmethyl (meth)acrylate, tetrahydrofurfuryl (meth)acrylate, butoxyethyl (meth)acrylate, ethoxydiethylene glycol (meth)acrylate, polyethylene glycol mono (meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: ARONIX M101, M102, M110, M111, M113, M117, M5700, TO-1317, M120, M150, and M156 (all of which are manufactured by Toagosei Co., Ltd.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of which are manufactured by Osaka Organic Chemical Industry Ltd.); LIGHT ACRYLATE BO-A, EC-A, DMP-A, THF-A, HOP-A, HOA-MPE, HOA-MPL, PO-A, P-200A, NP-4EA, and NP-8EA, and EPDXY ESTER M-600A (all of which are manufactured by Kyoeisha Chemical Co., Ltd.); KAYARAD TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by DKS); VP (manufactured by BASF); and ACMO, DMAA, and DMAPAA (all of which are manufactured by Kohjin Co., Ltd.).

In addition, multifunctional (meth)acrylic compounds each having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, phenyl ethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,12-dodecanediol di(meth)acrylate, 1,3-adamantane dimethanol di(meth)acrylate, o-xylylene di(meth)acrylate, m-xylylene di(meth)acrylate, p-xylylene di(meth)acrylate, tris(2-hydroxyethyl)isocyanurate tri(meth)acrylate, tris(acryloyloxy)isocyanurate, bis(hydroxymethyl) tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

Examples of commercial products corresponding to the multifunctional (meth)acrylic compounds include, but not limited to: YUPIMER UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); LIGHT ACRYLATE 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD PET-30, TMPTA, R-604, DPHA, DPCA-20, -30, -60, and -120, and HX-620, D-310, and D-330 (all of which are manufactured by Nippon Kayaku Co., Ltd.); ARONIX M208, M210, M215, M220, M240, M305, M309, M310, M315, M325, and M400 (all of which are manufactured by Toagosei Co., Ltd.); and Ripoxy VR-77, VR-60, and VR-90 (all of which are manufactured by Showa Denko KK).

Those radical polymerizable compounds may be used alone or in combination thereof. In the above-mentioned compound group, the term "(meth)acrylate" means an acrylate or a methacrylate having an alcohol residue equal to the acrylate. The term "(meth)acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure of a propylene oxide group.

The curable composition ($\alpha$1) preferably contains a polymerizable compound (A1) having an aromatic group and/or an alicyclic hydrocarbon group. Thus, the dry etching resistance of the curable composition ($\alpha$1) can be improved.

The curable composition ($\alpha$1) preferably contains the component (A1) serving as the polymerizable compound having an alkylene ether group. In addition, the composition more preferably contains the component (A1) serving as the polymerizable compound having two or more repeating units of an alkylene ether group. Thus, the heat generation quantity at the time of the mixing of the composition ($\alpha$1') of the components of the curable composition ($\alpha$1) except the component (D1) serving as a solvent and the curable composition ($\alpha$2) can be increased.

The curable composition ($\alpha$2) preferably contains the component (A2) serving as the polymerizable compound having an aromatic group and/or an alicyclic hydrocarbon group. Thus, the dry etching resistance of the curable composition ($\alpha$2) can be improved.

The blending ratio of the component (A1) serving as a polymerizable compound in the curable composition ($\alpha$1) is desirably 50 wt % or more and 100 wt % or less with respect to the total weight of the component (A1), the component (B1), and the component (C1), i.e., the total weight of the all components except the component (D1) serving as a solvent. In addition, the blending ratio is preferably 80 wt % or more and 100 wt % or less, more preferably_more than 90 wt % and 100 wt % or less.

When the blending ratio of the component (A1) serving as a polymerizable compound in the curable composition ($\alpha$1') is set to 50 wt % or more, a cured film to be obtained can be turned into a cured film having some degree of mechanical strength.

The blending ratio of the component (A2) serving as a polymerizable compound in the curable composition ($\alpha$2) is desirably 50 wt % or more and 99.9 wt % or less with respect to the total weight of the component (A2), the component (B2), and the component (C2), i.e., the total weight of the all components except the component (D2) serving as a solvent. In addition, the blending ratio is preferably 80 wt % or more and 99 wt % or less, more preferably more than 90 wt % and 98 wt % or less.

When the blending ratio of the component (A2) serving as a polymerizable compound in the curable composition ($\alpha$2') is set to 50 wt % or more, a cured film to be obtained can be turned into a cured film having some degree of mechanical strength.

In addition, as described below, it is preferred that the curable composition ($\alpha$1) contain the component (D1). The blending ratio of the component (A1) in the curable composition ($\alpha$1) is desirably 0.01 wt % or more and 10 wt % or less with respect to the total weight of the components of the curable composition ($\alpha$1) containing the component (D1) serving as a solvent.

<Component (B): Photopolymerization Initiator>

The component (B) is a photopolymerization initiator. The curable compositions ($\alpha$) according to the present invention may each further contain the component (B) serving as a photopolymerization initiator as well as the component (A) described in the foregoing in accordance with various purposes to the extent that the effects of the present invention are not impaired. The component (B) may include one kind of polymerization initiator, or may include a plurality of kinds of polymerization initiators.

The photopolymerization initiator is a compound that detects light having a predetermined wavelength to generate the above-mentioned polymerization factor (such as a radical). Specifically, the photopolymerization initiator is a polymerization initiator (radical generator) that generates a radical with light (an infrared ray, a visible ray, an ultraviolet ray, a far ultraviolet ray, an X-ray, charged particle rays such as an electron beam, a radiation).

Examples of the radical generator include, but not limited to: 2,4,5-triarylimidazole dimers that may have a substituent, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; $\alpha$-amino aromatic ketone derivatives, such as 2-benzyl-2-dimethylamino-1-(4-morpholinophenyl)-butanone-1,2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenyl anthraquinone, 2,3-diphenyl anthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyl diphenyl phosphine oxide, bis(2,4,6-trimethylbenzoyl) phenyl phosphine oxide, and bis-(2,6-dimethoxybenzoyl)-2,4,4-trimethylpentyl phosphine oxide; oxime ester derivatives, such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime); xanthone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure 184, 369, 651, 500, 819, 907, 784, and 2959, CGI-1700, -1750, and -1850, CG24-61, Darocur 1116 and 1173, Lucirin TPO, LR8893, and LR8970 (all of which are manufactured by BASF), and Ubecryl P36 (manufactured by UCB).

Of those, the component (B) is preferably an acylphosphine oxide-based polymerization initiator or an alkylphenone-based polymerization initiator. The acylphosphine oxide-based polymerization initiator is, of the examples described above, an acylphosphine oxide compound, such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide. In addition, the alkylphenone-based polymerization initiator is, of the examples described above: a benzoin ether derivative, such as benzoin methyl ether, benzoin ethyl ether, or benzoin phenyl ether; benzoin or a benzoin derivative, such as methylbenzoin, ethylbenzoin, or propylbenzoin; a benzyl derivative, such as benzyl dimethyl ketal; acetophenone or an acetophenone derivative, such as 3-methylacetophenone, acetophenone benzyl ketal, 1-hydroxycyclohexyl phenyl ketone, or 2,2-dimethoxy-2-phenylacetophenone; or an α-amino aromatic ketone derivative, such as 2-benzyl-2-dimethylamino-1-(4-morpholinophenyl)-butanone-1,2-methyl-1-[4-(methylthio)phenyl]-2-morpholino-propan-1-one.

In the present invention, it is preferred that the curable composition (α1) be substantially free of photoreactivity. To this end, the blending ratio of the component (B1) serving as a photopolymerization initiator in the curable composition (α1) is preferably set to less than 0.1 wt % with respect to the total of the component (A1), the component (B1), and the component (C1) serving as a non-polymerizable compound to be described later, i.e., the total weight of all components except the component (D1) serving as a solvent. In addition, the blending ratio is preferably 0.01 wt % or less, more preferably 0.001 wt % or less.

When the blending ratio of the component (B1) in the curable composition (α1) is set to less than 0.1 wt % with respect to the total of the component (A1), the component (B1), and the component (C1), the curable composition (α1) is substantially free of photoreactivity. In an imprint technology, depending on the construction of an apparatus, leaked light occurs at the time of the exposure of a shot area, and hence a shot area which is adjacent to the shot area and on which an imprinting step has not been performed is exposed in some cases. When the curable composition (α1) is free of photoreactivity, the photocuring of the curable composition (α1) due to the leaked light in the shot area on which the imprinting step has not been performed does not occur, and hence a pattern having a small number of non-filling defects is obtained also in the shot area even in a short filling time.

The curable composition (α2) preferably contains the two or more kinds of components (B2) serving as photopolymerizable initiators. Thus, the photocuring performance of the mixture of the curable composition (α1) and the curable composition (α2) can be improved.

The blending ratio of the component (B2) serving as a photopolymerization initiator in the curable composition (α2) is 0 wt % or more and 50 wt % or less, preferably 0.1 wt % or more and 20 wt % or less, more preferably 1 wt % or more and 20 wt % or less with respect to the total weight of the component (A2), the component (B2), and the component (C2) to be described later, i.e., the total weight of the components of the curable composition (α2) except the component (D2) serving as a solvent.

When the blending ratio of the component (B2) in the curable composition (α2) is set to 0.1 wt % or more with respect to the total weight of the component (A2), the component (B2), and the component (C2), the curing rate of the curable composition (α2) can be increased. As a result, reaction efficiency can be improved. In addition, when the blending ratio of the component (B2) is set to 50 wt % or less with respect to the total weight of the component (A2), the component (B2), and the component (C2), a cured product to be obtained can be turned into a cured product having some degree of mechanical strength.

<Nonpolymerizable Component (C)>

The curable compositions (α) according to the present invention may each further contain the component (C) serving as a nonpolymerizable compound as well as the component (A) and the component (B) described in the foregoing in accordance with various purposes to the extent that the effects of the present invention are not impaired. Examples of such component (C) include a sensitizer, a hydrogen donor, an internal release agent, a surfactant, an antioxidant, a polymer component, and other additives.

The sensitizer is a compound to be appropriately added for the purpose of accelerating a polymerization reaction or enhancing a reaction conversion ratio. As the sensitizer, there is given, for example, a sensitizing dye. The sensitizing dye is a compound that is excited by absorbing light having a specific wavelength to interact with the component (B) serving as the photopolymerization initiator. The term "interaction" as used herein refers to, for example, the transfer of energy or an electron from the sensitizing dye in an excited state to the component (B) serving as the photopolymerization initiator.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

The sensitizers may be used alone or as a mixture thereof.

The hydrogen donor is a compound capable of reacting with an initiation radical generated from the component (B) serving as the photopolymerization initiator or the radical of a polymerization growth terminal to generate a more reactive radical. The hydrogen donor is preferably added when the component (B) is a photoradical generator.

Specific examples of such hydrogen donor include, but not limited to, amine compounds, such as n-butylamine, di-n-butylamine, tri-n-butylamine, allylthiourea, a 4,4'-bis (dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds, such as 2-mercapto-N-phenylbenzimidazole and a mercaptopropionic acid ester, and sulfur compounds, such as s-benzylisothiuronium-p-toluenesulfinate, and phosphorous compounds, such as tri-n-butylphosphine.

The hydrogen donors may be used alone or as a mixture thereof. In addition, the hydrogen donor may have a function as a sensitizer.

The internal release agent may be added to each of the curable compositions (α) for the purpose of reducing an interfacial bonding force between a mold and the curable compositions (α), i.e., reducing a release force in a releasing step to be described later. The term "internal" as used herein means that the release agent is added to each of the curable compositions (α) in advance prior to an arranging step or dispensing step to be described later.

For example, surfactants, such as a silicone-based surfactant, a fluorine-based surfactant, and a hydrocarbon surfactant, can each be used as the internal release agent. In the present invention, the internal release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product corresponding to the fluorine-based surfactant include, but not limited to, MEGAFACE F-444, TF-2066, TF-2067, and TF-2068 (all of which are manufactured by DIC Corporation), Fluorad FC-430 and FC-431 (both of which are manufactured by 3M Japan Limited), SURFLON S-382 (manufactured by AGC), EFTOP EF-122A, 122B, and 122C, EF-121, EF-126, EF-127, and MF-100 (all of which are manufactured by Mitsubishi Materials Electronic Chemicals Co., Ltd.), PF-636, PF-6320, PF-656, and PF-6520 (all of which are manufactured by OMNOVA Solutions), UNIDYNE DS-401, DS-403, and DS-451 (all of which are manufactured by Daikin Industries, Ltd.), and Ftergent 250, 251, 222F, and 208G (all of which are manufactured by Neos Corporation).

The hydrocarbon surfactant includes, for example, an alkyl alcohol polyalkylene oxide adduct, in which an alkylene oxide having 2 or more and 4 or less carbon atoms is added to an alkyl alcohol having 1 or more and 50 or less carbon atoms.

Examples of the alkyl alcohol polyalkylene oxide adduct include a methyl alcohol polyethylene oxide adduct, a decyl alcohol polyethylene oxide adduct, a lauryl alcohol polyethylene oxide adduct, a cetyl alcohol polyethylene oxide adduct, a stearyl alcohol polyethylene oxide adduct, and a stearyl alcohol polyethylene oxide/propylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be converted to another substituent, for example, a polar functional group, such as a carboxyl group, an amino group, a pyridyl group, a thiol group, or a silanol group, or a hydrophobic functional group, such as an alkyl group or an alkoxy group.

As the alkyl alcohol polyalkylene oxide adduct, a commercial product may be used. Examples of the commercial product corresponding to the alkyl alcohol polyalkylene oxide adduct include, but not limited to, polyoxyethylene methyl ether (methyl alcohol polyethylene oxide adduct) (BLAUNON MP-400, MP-550, and MP-1000) manufactured by Aoki Oil Industrial Co., Ltd., polyoxyethylene decyl ether (decyl alcohol polyethylene oxide adduct) (FINESURF D-1303, D-1305, D-1307, and D-1310) manufactured by Aoki Oil Industrial Co., Ltd., polyoxyethylene lauryl ether (lauryl alcohol polyethylene oxide adduct) (BLAUNON EL-1505) manufactured by Aoki Oil Industrial Co., Ltd., polyoxyethylene cetyl ether (cetyl alcohol polyethylene oxide adduct) (BLAUNON CH-305 and CH-310) manufactured by Aoki Oil Industrial Co., Ltd., polyoxyethylene stearyl ether (stearyl alcohol polyethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol A760E) manufactured by BASF, and polyoxyethylene alkyl ethers (EMULGEN Series) manufactured by Kao Chemicals.

Of those hydrocarbon surfactants, an alkyl alcohol polyalkylene oxide adduct is preferred as the internal release agent, and a long-chain alkyl alcohol polyalkylene oxide adduct is more preferred. The internal release agents may be used alone or as a mixture thereof. When the internal release agent is added to a curable composition, at least one of a fluorine-based surfactant or a hydrocarbon surfactant is preferably added as the internal release agent.

The blending ratio of the component (C) serving as a nonpolymerizable compound in each of the curable compositions (α) is 0 wt % or more and 50 wt % or less, preferably 0.1 wt % or more and 50 wt % or less, more preferably 0.1 wt % or more and 20 mass % or less with respect to the total weight of the component (A), the component (B), and the component (C), i.e., the total weight of the components of the curable compositions (α) except the component (D) serving as a solvent. When the blending ratio of the component (C) is set to 50 wt % or less with respect to the total weight of the component (A), the component (B), and the component (C), a cured product to be obtained can be turned into a cured product having some degree of mechanical strength.

<Solvent Component (D)>

The curable compositions (α) according to the present invention may each contain the component (D) serving as a solvent. The component (D) is not particularly limited as long as the solvent dissolves the component (A), the component (B), and the component (C). A preferred solvent is a solvent having a boiling point at normal pressure of 80° C. or more and 200° C. or less. A solvent having at least one of a hydroxyl group, an ether structure, an ester structure, or a ketone structure is more preferred.

A preferred specific example of the component (D) according to the present invention is one kind selected from alcohol-based solvents, such as propyl alcohol, isopropyl alcohol, and butyl alcohol, ether-based solvents, such as ethylene glycol monomethyl ether, ethylene glycol dimethyl ether, ethylene glycol monoethyl ether, ethylene glycol diethyl ether, ethylene glycol monobutyl ether, and propylene glycol monomethyl ether, ester-based solvents, such as butyl acetate, ethylene glycol monoethyl ether acetate, ethylene glycol monobutyl ether acetate, and propylene glycol monomethyl ether acetate, and ketone-based solvents, such as methyl isobutyl ketone, diisobutyl ketone, cyclohexanone, 2-heptanone, γ-butyrolactone, and ethyl lactate, or a mixed solvent of two or more kinds thereof.

The curable composition (α1) according to the present invention preferably contains the component (D1). This is because, as described later, spin coating is preferred as a method for applying the curable composition (α1) onto the substrate. In this case, one kind selected from propylene glycol monomethyl ether acetate, propylene glycol monomethyl ether, cyclohexanone, 2-heptanone, γ-butyrolactone, and ethyl lactate, or a mixed solution of two or more kinds thereof is particularly preferred from the viewpoint of applicability.

The blending ratio of the component (D1) according to the present invention in the curable composition (α1), which can be appropriately adjusted by, for example, the viscosity and applicability of the component (A1), the component (B1), or the component (C1), and the thickness of a liquid film to be formed, is preferably 70 wt % or more with respect to the total amount of the curable composition (α1). The blending ratio is more preferably 90 wt % or more, still more preferably 95 wt % or more. As the blending ratio of the component (D1) increases, the thickness of the liquid film to be formed can be reduced. When the blending ratio of the component (D1) in the curable composition (α1) is 70 wt % or less, sufficient applicability is not obtained in some cases.

In addition, the component (D1) in the curable composition (α1) after applying is preferably removed between the arranging step and the dispensing step by volatilization and so on.

In addition, a component (D2) serving as a solvent can be used in the curable composition (α2) according to the present invention, but it is preferred that the curable composition (α2) be substantially free of any solvent. The phrase "substantially free of any solvent" as used herein means that the composition is free of a solvent except a solvent to be unintentionally incorporated, such as impurities. That is, for example, the content of the component (D2) serving as a solvent in the curable composition (α2) according to the present invention is preferably 3 wt % or less, more preferably 1 wt % or less with respect to the entirety of the curable composition (α2). The term "solvent" as used herein refers to a solvent that has been generally used in a curable composition or a photoresist. That is, the kind of the solvent is not particularly limited as long as a compound to be used in the present invention is dissolved and uniformly dispersed in the solvent, and the solvent does not react with the compound.

Each of the curable compositions (α) according to the present invention is preferably a curable composition for a nanoimprint, more preferably a curable composition for a photo-nanoimprint, still more preferably a curable composition to be used in the above-mentioned SST-NIL process, i.e., a curable composition for SST-NIL.

The ratio of the component (A), the component (B), the component (C), or the component (D) in each of the curable compositions (α) according to the present invention can be determined through the analysis of the curable composition (α) or a cured product obtained by curing the composition by, for example, infrared spectroscopy, ultraviolet-visible spectroscopy, or thermal decomposition gas chromatography-mass spectrometry.

<Temperature at Time of Blending of Each of Curable Compositions (α)>

When each of the curable compositions (α) according to the present invention is prepared, the respective components are mixed and dissolved under a predetermined temperature condition. Specifically, the mixing and the dissolution are performed at a temperature in the range of from 0° C. or more to 100° C. or less.

<Viscosity of Curable Composition (α)>

The curable compositions (α1) and (α2) according to the present invention are preferably liquid. This is because in a mold contacting step to be described later, since the curable compositions (α1) and (α2) are liquid, the spread and fill of the curable composition (α1) and/or the curable composition (α2) are quickly completed, in other words, a filling time is short.

In the curable composition (α1) according to the present invention, a composition (α1') of a curable composition (α1) of components except the component (D1) serving as a solvent preferably has a viscosity at 23° C. of 1 mPa·s or more and 1,000 mPa·s or less. In addition, the viscosity is more preferably 1 mPa·s or more and 500 mPa·s or less, still more preferably 1 mPa·s or more and 100 mPa·s or less.

In the curable composition (α2) according to the present invention, a composition (α2') of a curable composition (α2) of components except the component (D2) serving as a solvent preferably has a viscosity at 23° C. of 1 mPa·s or more and 100 mPa·s or less. In addition, the viscosity is more preferably 1 mPa·s or more and 50 mPa·s or less, still more preferably 1 mPa·s or more and 12 mPa·s or less.

It is preferred that the curable composition (α2) do not contain the component (D2) serving as a solvent and have the at 23° C. of 1 mPa·s or more and 100 mPa·s or less, more preferably 1 mPa·s or more and 50 mPa·s or less, still more preferably 1 mPa·s or more and 12 mPa·s or less.

When the viscosities of the compositions (α') of the components of the curable compositions (α) except the components (D) serving as solvents are set to 100 mPa·s or less, spread and fill are quickly completed at the time of the bringing of the curable compositions (α) into contact with the mold (S. Reddy, R. T. Bonnecaze, Microelectronic Engineering, 82, 60-70 (2005)). In other words, when the curable compositions (α) according to the present invention are used, a photo-nanoimprint method can be performed at high throughput. In addition, a pattern defect due to a filling failure hardly occurs.

In addition, when the viscosities are set to 1 mPa·s or more, application unevenness hardly occurs at the time of the application of the curable compositions (α) onto the substrate. Further, when the curable compositions (α) are brought into contact with the mold, the curable compositions (α) hardly flow out of an end portion of the mold.

<Surface Tensions of Curable Compositions (α)>

With regard to the surface tensions of the curable compositions (α) according to the present invention, a composition (α') of components of the curable compositions (α) except the components (D) serving as solvents each preferably have a surface tension at 23° C. of 5 mN/m or more and 70 mN/m or less. In addition, the surface tension is more preferably 7 mN/m or more and 50 mN/m or less, still more preferably 10 mN/m or more and 40 mN/m or less. Here, as the surface tensions become higher, for example, when the surface tensions are 5 mN/m or more, stronger capillary forces act, and hence the spread and fill of the compositions (α') are completed in a shorter time period at the time of the bringing of the compositions (α') into contact with the mold (S. Reddy, R. T. Bonnecaze, Microelectronic Engineering, 82, 60-70 (2005)). In addition, when the surface tensions are set to 70 mN/m or less, a cured product obtained by curing the compositions (α') becomes a cured product having surface smoothness.

In the present invention, the surface tension of the composition (α1') of the curable composition (α1) of components except the component (D1) serving as a solvent is preferably higher than the surface tension of the composition (α2') of the curable composition (α2) of components except the component (D2) serving as a solvent. This is because of the following reason. Before the mold contacting step, the prespread of the curable composition (α2) is accelerated (liquid droplets spread over a wide range) by a Marangoni effect to be described later, and hence a time period required for spread in the mold contacting step to be described later is shortened. As a result, a filling time is shortened.

The Marangoni effect is a free surface movement phenomenon resulting from a local difference in surface tension between liquids (N. Imaishi, Int. J. Microgravity Sci. No. 31 Supplement 2014 (S5-S12)). The difference in surface tension, in other words, the difference in surface energy serves as a driving force to cause such diffusion that a liquid having a low surface tension covers a wider surface. In other words, when the curable composition (α2) having a low surface tension is dispensed dropwise on the composition (α1) having a high surface tension applied to the entire surface of the substrate, the prespread of the curable composition (α2) is accelerated.

<Contact Angles of Curable Compositions (α)>

With regard to the contact angle of each of the curable composition (α1) and the curable composition (α2) according to the present invention, the contact angle of each of the composition (α1') of components of the curable composition (α1) except the components (D1) serving as solvents and the curable composition (α2) is preferably 0° or more and 90° or less with respect to each of both the surface of the substrate and the surface of the mold. When the contact angle is more than 90°, a capillary force acts in a negative direction (direction in which a contact interface between the mold and each of the curable compositions is shrunk) in a mold pattern or in a gap between the substrate and the mold, and hence the compositions are not filled. The contact angle is particularly preferably 0° or more and 30° or less. As the contact angle becomes lower, a stronger capillary force acts and hence a filling rate increases (S. Reddy, R. T. Bonnecaze, Microelectronic Engineering, 82, 60-70 (2005)).

The viscosity, the surface tension, and the contact angle of the curable composition (α1) according to the present invention can be changed by addition of the component (D1) serving as a solvent. However, the component (D1) serving as a solvent may prevent curing of the curable composition (α1). Accordingly, the component (D1) serving as a solvent in the curable composition (α1) is removed before the dispensing step by volatilization and so on. In addition, the curable composition (α2) does not substantially contain the component (D2) serving as a solvent. Accordingly, it is preferred that the viscosity, the surface tension, and the contact angle of the composition (α1') of components of the curable composition (α1) except the components (D1) serving as solvents and the curable composition (α2) be set in the predetermined values.

[Impurities Included in Curable Compositions (α)]

The curable compositions (α) according to the present invention each preferably contain as small an amount of impurities as possible. The term "impurities" as used herein refers to a component except those intentionally incorporated into the curable compositions (α). That is, the term refers to a component except the component (A), the component (B), the component (C), and the component (D). Specific examples of the impurities include, but not limited to, particles, metal impurities, and organic impurities.

Therefore, the curable compositions (α) according to the present invention are each preferably obtained through a purifying step. Such purifying step is preferably, for example, filtration with a filter. When the filtration with a filter is performed, specifically, it is preferred that the component (A) described in the foregoing, and the component (B), the component (C), and the component (D) to be added as required be mixed, and then the mixture be filtered with a filter having a pore diameter of, for example, 0.001 µm or more and 5.0 µm or less. When the filtration with a filter is performed, it is more preferred that the filtration be performed in a plurality of stages or be repeated a plurality of times. In addition, the filtered liquid may be filtered again. The filtration may be performed with a plurality of filters having different pore diameters. Specific examples of a method for the filtration with a filter include, but not limited to, normal pressure filtration, pressure filtration, reduced pressure filtration, and circulation filtration. A filter made of, for example, a polyethylene resin, a polypropylene resin, a fluorine resin, or a nylon resin can be used as the filter to be used in the filtration, but the filter is not particularly limited. Specific examples of the filter that can be used in the present invention include "Ultipleat P-Nylon 66", "Ultipor N66", and "P Emflon" (all of which are manufactured by Nihon Pall Ltd.), "LifeASSURE PSN Series", "LifeASSURE EF Series", "PhotoSHIELD", and "Electropor IIEF" (all of which are manufactured by 3M Japan Limited), and "Microgard", "Optimizer D", "Impact Mini", and "Impact 2" (all of which are manufactured by Entegris Japan Co., Ltd.). Those filters may be used alone or in combination thereof.

The impurities included in each of the curable compositions (α), such as particles, can be removed through such purifying step. Thus, the following situations due to the impurities, such as particles, can be prevented: grooves and lands carelessly occur on a cured film obtained after the curing of the curable compositions (α) to cause a pattern defect; and the mold breaks in a mold contacting step or an aligning step to be described later.

When the curable compositions (α) according to the present invention are used for the manufacture of a semiconductor integrated circuit, it is preferred to avoid the mixing of metal atom-containing impurities (metal impurities) in the curable compositions (α) to the extent possible in order to prevent the operation of a product from being inhibited.

Therefore, each of the curable compositions (α) is preferably prevented from being brought into contact with a metal in its manufacturing process. That is, when the respective materials are weighed or when the materials are blended and stirred, it is preferred to refrain from using a metallic weighing device, container, or the like. In addition, filtration with a metal impurity-removing filter may be further performed in the purifying step (particle removing step) described in the foregoing.

Filters made of, for example, cellulose, diatomaceous earth, and an ion exchange resin can each be used as the metal impurity-removing filter, but the filter is not particularly limited. For example, "Zeta Plus GN Grade" or "Electropor" (manufactured by 3M Japan Limited), "Posidyne", "IonKleen AN", or "IonKleen SL" (manufactured by Nihon Pall Ltd.), or "Protego" (manufactured by Entegris Japan Co., Ltd.) can be used as the metal impurity-removing filter. Those metal impurity-removing filters may be used alone or in combination thereof.

Those metal impurity-removing filters are preferably used after having been washed. A preferred washing method is as follows: washing with ultrapure water, washing with an alcohol, and prewashing with any one of the curable compositions (α) are performed in this order.

The pore diameter of the metal impurity-removing filter is, for example, suitably 0.001 µm or more and 5.0 µm or less, preferably 0.003 µm or more and 0.01 µm or less. When the pore diameter is more than 5.0 µm, the ability of the filter to adsorb particles and metal impurities is low. In addition, when the pore diameter is less than 0.001 µm, the filter traps even constituent components for each of the curable compositions (α), and hence there is a risk in that the composition of the curable composition (α) is fluctuated or a risk in that the clogging of the filter occurs.

In this case, the concentration of the metal impurities in each of the curable compositions (α) is preferably 10 ppm or less, more preferably 100 ppb or less.

[Cured Film]

A cured product is obtained by curing the curable compositions (α) according to the present invention. At this time, a cured film is preferably obtained by applying the curable compositions (α) onto a base material to form an applied film, and then curing the applied film. A method for forming the applied film and a method for forming the cured product or the cured film are described later.

[Method for Forming Cured Product Pattern]

Figure 3:
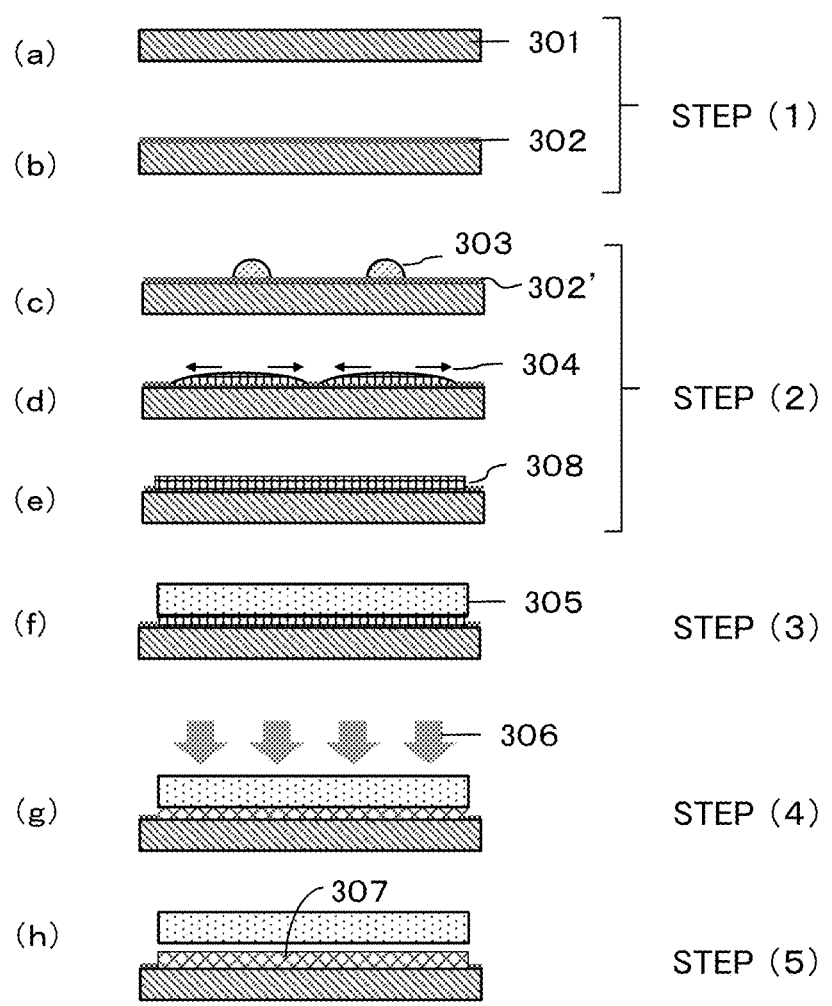
FIG. 3 is schematic sectional view for illustrating a photo-nanoimprint technology according to one embodiment of the present invention.

Next, a method for forming a cured product pattern including forming the cured product pattern with the curable compositions (α) according to the present invention is described with reference to the schematic sectional views of FIG. 3.

The method for fabricating a cured product pattern according to the present invention includes:

(1) a first step (arranging step) of arranging a layer formed of a liquid film of a curable composition (α1) 302 containing at least a component (A1) serving as a polymerizable compound on a substrate 301;

(2) a second step (dispensing step) of dispensing liquid droplets of a curable composition (α2) 303 containing at least a component (A2) serving as a polymerizable compound discretely onto a layer formed of a liquid film of a composition (α1') 302' of components of the curable composition (α1) 302 except a component (D1) serving as a solvent;

(3) a third step (mold contacting step) of bringing a mixture layer obtained by mixing the composition (α1') 302' and the curable composition (α2) 303 into contact with a mold 305;

(4) a fourth step (light irradiating step) of irradiating the mixture layer with light from a side of the mold 305 to cure the layer; and (5) a fifth step (releasing step) of releasing the mold 305 from the mixture layer after the curing.

The method for fabricating a cured product pattern according to the present invention is a method for forming a cured product pattern involving utilizing a photo-nanoimprint method.

A cured film obtained by the method for fabricating a cured product pattern according to the present invention is preferably a cured product pattern having a pattern having a size of 1 nm or more and 10 mm or less. In addition, the cured film is more preferably a cured product pattern having a pattern having a size of 10 nm or more and 100 μm or less. In general, a pattern forming technology for producing a film having a pattern (uneven structure) of a nanosize (1 nm or more and 100 nm or less) through the use of light is called a photo-nanoimprint method. The pattern fabricating method according to the present invention uses the photo-nanoimprint method. Each step is hereinafter described.

<Arranging Step (First Step)>

In arranging step, as illustrated in FIG. 3(a) and FIG. 3(b), the curable composition (α1) 302 according to the present invention described in the foregoing is arranged (applied) onto the substrate 301 to form an applied film serving as an imprint pretreatment coating. In the case where the liquid film serving as the imprint pretreatment coating is formed on the substrate 301, when a liquid droplet of the curable composition (α2) 303 is dispensed in the dispensing step to be described later, the spread of a liquid droplet component in a substrate surface direction is accelerated. The phrase "the spread is accelerated" means that in the case where the liquid droplet is dispensed onto the imprint pretreatment coating, the liquid droplet spreads in the substrate surface direction at a spreading speed faster than that in the case where the liquid droplet is directly dispensed onto the substrate 301. As a result, the liquid droplets of the curable composition (α2) 303 dispensed dropwise discretely expand quickly on the liquid film of the composition (α1') 302' of the components of the curable composition (α1) 302 except the component (D1) serving as a solvent, and hence an imprint process in which a filling time is short and throughput is high can be provided.

The substrate 301 on which the curable composition (α1) 302 serving as a component for a coating material for imprint pretreatment is to be arranged is a substrate to be processed, and a silicon wafer is typically used. A layer to be processed may be formed on the substrate 301. Any other layer may be further formed between the substrate 301 and the layer to be processed.

In the present invention, the substrate 301 is not limited to the silicon wafer. The substrate 301 can also be arbitrarily selected from substrates known as substrates for semiconductor devices, such as aluminum, a titanium-tungsten alloy, an aluminum-silicon alloy, an aluminum-copper-silicon alloy, silicon oxide, and silicon nitride. In addition, when a quartz substrate is used as the substrate 301, a replica of a quartz imprint mold (quartz mold replica) can be produced. A substrate improved in adhesiveness with the composition (α1') 302' of the components of the curable composition (α1) 302 except the component (D1) serving as a solvent and the curable composition (α2) 303 by forming an adhesion layer through a surface treatment, such as a silane coupling treatment, a silazane treatment, or the formation of an organic thin film, may be used as the substrate 301 (substrate to be processed) to be used.

In the present invention, as a method for arranging the curable composition (α1) 302 serving as a component for a coating material for imprint pretreatment on the substrate 301, there may be used, for example, an inkjet method, dip coating, air knife coating, curtain coating, wire bar coating, gravure coating, extrusion coating, spin coating, or a slit scan method. In the present invention, spin coating is particularly preferred.

When the curable composition (α1) 302 is arranged on the substrate 301 or the layer to be processed by using the spin coating, the solvent component (D1) may be volatilized by performing a baking step as required.

The average thickness of the composition (α1') 302' of the components of the curable composition (α1) 302 except the component (D1) serving as a solvent, which varies depending on applications where the cured film is used, is, for example, 0.1 nm or more and 10,000 nm or less, preferably 1 nm or more and 20 nm or less, particularly preferably 1 nm or more and 10 nm or less.

<Dispensing Step (Second Step)>

In dispensing step, as illustrated in FIG. 3(c), the liquid droplets of the curable composition (α2) 303 are preferably dispensed discretely onto the layer of the composition (α1') 302' of the components of the curable composition (α1) 302 except the component (D1) serving as a solvent, the layer being arranged as the imprint pretreatment coating on the substrate 301. An inkjet method is particularly preferred as a dispensing method. The liquid droplets of the curable composition (α2) 303 are densely arranged on the substrate 301 facing an area where groove portions are densely present on the mold 305, and are sparsely arranged on the substrate 301 facing an area where groove portions are sparsely present. Thus, the thickness of a residual film to be described later can be controlled to a uniform value irrespective of the density of a pattern on the mold 305.

In the present invention, the liquid droplets of the curable composition (α2) 303 dispensed in the dispensing step are quickly spread by the Marangoni effect using a difference in surface energy (surface tension) as a driving force as described in the foregoing as indicated by arrows 304 each indicating the direction in which a liquid droplet spreads (prespread) (FIG. 3(d)). When the curable composition (α1) 302 is free of the component (B) serving as a photopolymerization initiator and is hence substantially free of photoreactivity, as a result of the mixing of the composition (α1') 302' of the components of the curable composition (α1) 302 except the component (D1) serving as a solvent and the curable composition (α2) 303, the component (B) serving as a photopolymerization initiator of the curable composition (α2) 303 migrates to the curable composition (α1') 302', and hence the composition (α1') 302' obtains photosensitivity for the first time.

Figure 2:
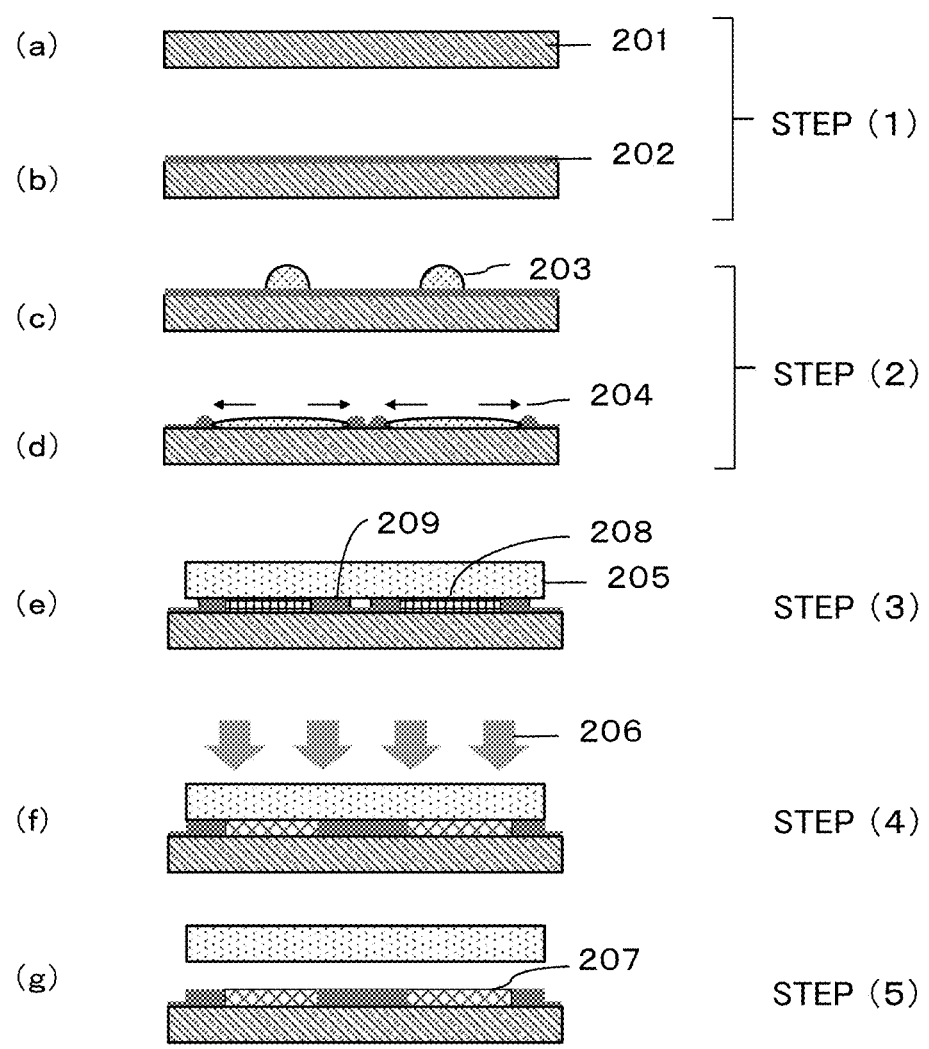
FIG. 2 is schematic sectional view for illustrating a problem to be solved by the present invention.

The mixing of the composition (α1') 302' of the components of the curable composition (α1) 302 except the component (D1) serving as a solvent and a liquid droplet of the curable composition (α2) 303 in a shot area typically depends on mutual diffusion based on a difference in composition, and hence it takes a time as long as from several seconds to several tens of seconds for the composition of the mixture to become uniform. When the time period for which the curable composition (α2) 203 is diffused into the composition (α1') 302' is insufficient, as illustrated in FIG. 2(e), the area 209 where the composition (α1') 302' and the curable composition (α2) 203 are not sufficiently mixed occurs. The dry etching resistance of a cured product in the area 209 where the composition (α1') 202' and the curable composition (α2) 203 are not sufficiently mixed reduces after its curing with the irradiation light 206 of FIG. 2(f) comparison with a cured product of the mixture 308 in which the composition (α1') 302' and the curable composition (α2) 303 are not sufficiently mixed. Accordingly, the following inconvenience occurs: when a film formed of those compositions is etched in a subsequent step i.e. residual film removing step, an unintentional place is etched. The residual film removing step is described in detail in <Residual Film Removing Step (Sixth Step) of removing Part of Cured Film>.

In view of the foregoing, in order that the mixing of the composition (α1') 302' and the curable composition (α2) 303 may be quickly performed, in the present invention, it has been found that in the case where the composition (α1') 302' of the components of the curable composition (α1) 302 except the solvent component (D1) and the curable composition (α2) 303 whose mixing is exothermic are used, an increase in viscosity resulting from a reduction in temperature of a mixing interface or a reduction in temperature of the entirety of the mixed liquid when the curable composition (α2) 303 is dispensed dropwise and mixed onto the composition (α1') 302' of the components of the curable composition (α1) 302 except the solvent component (D1) is prevented, and hence the mixing of the composition (α1') 302' and the curable composition (α2) 303 can be accelerated, i.e., a liquid film of the mixture 308 in which the composition (α1') 302' and the curable composition (α2) 303 are mixed (FIG. 3(e)) having uniform physical properties in a shot area of the substrate can be obtained in a shorter time period. Thus, there can be provided a pattern fabricating method by which a pattern having uniform physical properties in a shot area of a substrate can be formed at high throughput.

<Mold Contacting Step (Third Step)>

Next, the mold 305 having an original pattern for transferring a pattern shape is brought into contact with the mixture 308 of the composition (α1') 302' of the components of the curable composition (α1) 302 except the component (D1) serving as a solvent and the curable composition (α2) 303, the mixture 308 having been formed in the first step and the second step (the arranging step and the dispensing step) as illustrated in FIG. 3(f). Thus, the mixture 308 of the composition (α1') 302' of the components of the curable composition (α1) 302 except the component (D1) serving as a solvent and the curable composition (α2) 303 is filled into a groove portion of a fine pattern on the surface of the mold 305, and hence a liquid film filled into the fine pattern of the mold 305 is obtained.

After the completion of the second step and before the initiation of this step, the position of the mold 305 and/or the substrate 301 (substrate to be processed) can be adjusted as required so that a mold-side registration mark and a registration mark of the substrate 301 (substrate to be processed) may coincide with each other (aligning step).

The mold 305 that is formed of an optically transparent material is desirably used as the mold 305 considering the next fourth step (light irradiating step). Preferred specific examples of the material for forming the mold 305 include glass, quartz, an optically transparent resin, such as PMMA or a polycarbonate resin, a transparent metal-deposited film, a flexible film made of polydimethylsiloxane or the like, a photocured film, and a metal film. In the case of using the optically transparent resin as the material for forming the mold 305, it is necessary to select a resin that does not dissolve in a component contained in the composition (α1') 302' of the components of the curable composition (α1) 302 except the component (D1) serving as a solvent and the curable composition (α2) 303. Quartz is particularly preferred as the material for forming the mold 305 because of its small thermal expansion coefficient and small pattern deformation.

It is preferred that the fine pattern on the surface of the mold 305 have a pattern height (H) of 1 nm or more and 1,000 nm or less. In addition, it is preferred that the fine pattern have a width (S) of each groove portion of 1 nm or more and 1,000 nm or less, more preferably 4 nm or more and 30 nm or less. Further, it is preferred that the fine pattern have an aspect ratio (H/S) of each groove portion of the groove/land pattern of 1 or more and 10 or less.

The mold 305 may be subjected to a surface treatment before this step serving as the step of bringing the composition (α1') 302' of the components of the curable composition (α1) 302 except the component (D1) serving as a solvent and the curable composition (α2) 303, and the mold 305 into contact with each other in order that peelability between each of the composition (α1') 302' of the components of the curable composition (α1) 302 except the component (D1) serving as a solvent and the curable composition (α2) 303, and the surface of the mold 305 may be improved. As a method for the surface treatment, there is given a method involving forming a release agent layer by applying a release agent onto the surface of the mold 305. In this case, examples of the release agent to be applied onto the surface of the mold 305 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent such as OPTOOL DSX manufactured by Daikin Industries, Ltd. can be suitably used. The release agents may be used alone or in combination thereof. Of those, fluorine-based and hydrocarbon-based release agents are particularly preferred.

In the mold contacting step, when the mold 305, and the composition (α1') 302' of the components of the curable composition (α1) 302 except the component (D1) serving as a solvent and the curable composition (α2) 303 are brought into contact with each other as illustrated in FIG. 3(f), a pressure to be applied to the composition (α1') 302' of the components of the curable composition (α1) 302 except the component (D1) serving as a solvent and the curable composition (α2) 303 is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

In the present invention, the prespread of the liquid droplets of the curable composition (α2) 303 has progressed in the previous step, and hence the spread of the curable composition (α2) 303 in this step is quickly completed.

At this time, in the present invention, the composition (α1') 302' of the components of the curable composition (α1) 302 except the component (D1) serving as a solvent and the curable composition (α2) 303 whose mixing is exothermic are used. Accordingly, an increase in viscosity resulting from a reduction in temperature of a mixing interface or a reduction in temperature of the entirety of the mixed liquid when the curable composition (α2) 303 is dispensed dropwise and mixed onto the composition (α1') 302' of the components of the curable composition (α1) 302 except the component (D1) serving as a solvent is prevented, and hence the mixing of the composition (α1') 302 and the curable composition (α2) 303 can be accelerated. Thus, the liquid film having uniform physical properties in a shot area of the substrate is obtained in a shorter time period.

As described above, the spread and fill of the composition (α1') 302' of the components of the curable composition (α1) 302 except the component (D1) serving as a solvent and the curable composition (α2) 303 are quickly completed in this step, and hence the time period for which the mold 305, and the composition (α1') 302' of the components of the curable composition (α1) 302 except the component (D1) serving as a solvent and the curable composition (α2) 303 are brought into contact with each other can be set to a short time period. In other words, one of the effects of the present invention is as follows: many pattern forming steps can be completed within a short time period, and hence high productivity is obtained. The time period for which the mold and the compositions are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1 second or less. When the time period is shorter than 0.1 second, the following tendency is observed: the spread and the fill become insufficient, and hence many defects called non-filling defects occur.

The average thickness of the composition (α1') 302' of the components of the curable composition (α1) 302 except the component (D1) serving as a solvent and the curable composition (α2) 303 at the time of the completion of the spread and the fill (shape-transferred layer) is, for example, 0.001 μm or more and 100.0 μm or less, though the average thickness varies depending on applications where the cured film is used.

Although this step can be performed under any condition of an air atmosphere, a reduced pressure atmosphere, and an inert gas atmosphere, this step is preferably performed under a reduced pressure atmosphere or an inert gas atmosphere because an influence of oxygen or moisture on a curing reaction can be prevented. When this step is performed under an inert gas atmosphere, specific examples of the inert gas that can be used include nitrogen, carbon dioxide, helium, argon, various fluorocarbon gases, and a mixed gas thereof. A preferred pressure when this step is performed under a particular gas atmosphere including an air atmosphere is 0.0001 atm or more and 10 atm or less.

The mold contacting step may be performed under an atmosphere containing a condensable gas (hereinafter referred to as "condensable gas atmosphere"). The term "condensable gas" as used herein refers to the following gas: when the gas in the atmosphere is filled into a groove portion of the fine pattern formed on the mold 305, and a gap between the mold 305 and the substrate 301 together with the composition (α1') 302' of the components of the curable composition (α1) 302 except the component (D1) serving as a solvent and the curable composition (α2) 303, the gas is condensed by a capillary pressure generated at the time of the filling to liquefy. The condensable gas is present as a gas in the atmosphere before the composition (α1') 302' of the components of the curable composition (α1) 302 except the component (D1) serving as a solvent and the curable composition (α2) 303, and the mold 305 are brought into contact with each other in the mold contacting step (FIG. 3(c) to FIG. 3(e)).

When the mold contacting step is performed under the condensable gas atmosphere, the gas filled into a groove portion of the fine pattern liquefies, and hence air bubbles disappear. Accordingly, a filling property becomes excellent. The condensable gas may be dissolved in the composition (α1') 302' of the components of the curable composition (α1) 302 except the component (D1) serving as a solvent and/or the curable composition (α2) 303.

The boiling point of the condensable gas, which is not limited as long as the boiling point is equal to or less than the ambient temperature of the mold contacting step, is preferably from −10° C. to 23° C., more preferably from 10° C. to 23° C. When the boiling point falls within the range, the filling property is more excellent.

The vapor pressure of the condensable gas at the ambient temperature of the mold contacting step is preferably from 0.1 MPa to 0.4 MPa, though the vapor pressure is not limited as long as the vapor pressure is equal to less than the pressure to be applied to the composition (α1') 302' of the components of the curable composition (α1) 302 except the component (D1) serving as a solvent and the curable composition (α2) 303 when the mold 305, and the composition (α1') 302' of the components of the curable composition (α1) 302 except the component (D1) serving as a solvent and the curable composition (α2) 303 are brought into contact with each other at the time of imprinting in the mold contacting step. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated. The ambient temperature in the mold contacting step, which is not particularly limited, is preferably from 20° C. to 25° C.

Specific examples of the condensable gas include fluorocarbons, such as: a chlorofluorocarbon (CFC), such as trichlorofluoromethane; a fluorocarbon (FC); a hydrochlorofluorocarbon (HCFC); a hydrofluorocarbon (HFC), such as 1,1,1,3,3-pentafluoropropane ($CHF_2CH_2CF_3$, HFC-245fa, PFP); and a hydrofluoroether (HFE), such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step is from 20° C. to 25° C., the filling property is excellent. Further, 1,1,1,3,3-pentafluoropropane is particularly preferred from the viewpoint of being excellent in safety.

The condensable gases may be used alone or as a mixture thereof. In addition, any such condensable gas may be mixed with a non-condensable gas, such as air, nitrogen, carbon dioxide, helium, or argon, before use. The non-condensable gas with which the condensable gas is mixed is preferably helium from the viewpoint of the filling property. Helium can permeate the mold 305. Accordingly, when the gases (the condensable gas and helium) in the atmosphere are filled into a groove portion of the fine pattern formed on the mold 305 in the mold contacting step together with the composition (α1') 302' of the components of the curable composition (α1) 302 except the component (D1) serving as a solvent and/or the curable composition (α2) 303, the condensable gas liquefies and helium permeates the mold 305.

<Light Irradiating Step (Fourth Step)>

Next, as illustrated in FIG. 3(g), the mixture layer obtained by mixing the composition (α1') 302' of the components of the curable composition (α1) 302 except the component (D1) serving as a solvent and the curable composition (α2) 303 is irradiated with irradiation light 306 through the mold 305. In more detail, the composition (α1') 302' of the components of the curable composition (α1) 302 except the component (D1) serving as a solvent and/or the curable composition (α2) 303 filled into the fine pattern of the mold 305 is irradiated with the irradiation light 306 through the mold 305. Thus, the composition (α1') 302' of the components of the curable composition (α1) 302 except the component (D1) serving as a solvent and/or the curable composition (α2) 303 filled into the fine pattern of the mold 305 is cured by the irradiation light 306 to form a cured film 307 having a pattern shape.

Here, the irradiation light 306 with which the composition (α1') 302' of the components of the curable composition (α1) 302 except the component (D1) serving as a solvent and the curable composition (α2) 303 filled into the fine pattern of the mold 305, the compositions constituting the shape-transferred layer, are irradiated is selected in accordance with the sensitivity wavelengths of the composition (α1') 302' of the components of the curable composition (α1) 302 except the component (D1) serving as a solvent and the curable composition (α2) 303. Specifically, it is preferred that UV light having a wavelength of 150 nm or more and 400 nm or less, an X-ray, an electron beam, or the like be appropriately selected and used.

Of those, UV light is particularly preferred as the light (irradiation light 306) with which the composition (α1') 302' of the components of the curable composition (α1) 302 except the component (D1) serving as a solvent and the curable composition (α2) 303 are irradiated. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and an F2 excimer laser. Of those, an ultra-high pressure mercury lamp is particularly preferred. In addition, the number of the light sources to be used may be one or two or more. In addition, when the light irradiation is performed, the light irradiation may be performed on the entire surface of the shape-transferred layer (the composition (α1') 302' of the components of the curable composition (α1) 302 except the component (D1) serving as a solvent and the curable composition (α2) 303) filled into the fine pattern of the mold 305, or may be performed only on a partial area thereof.

In addition, the light irradiation may be performed on an entire region on the substrate 301 intermittently a plurality of times, or may be continuously performed on the entire region. Further, the following may be performed: a partial region A is irradiated with the light in a first irradiating process, and a region B different from the region A is irradiated with the light in a second irradiating process.

<Releasing Step (Fifth Step)>

Next, the mold 305 is released from the cured film 307 having a pattern shape. In this step, as illustrated in FIG. 3(h), the mold 305 is released from the cured film 307 having a pattern shape. Thus, the cured film 307 having a pattern shape serving as the reverse pattern of the fine pattern formed on the mold 305, the film being formed in the fourth step (light irradiating step), is obtained.

When the mold contacting step is performed under the condensable gas atmosphere, the condensable gas evaporates in association with a reduction in pressure at an interface where the cured film 307 having a pattern shape and the mold 305 are in contact with each other at the time of the release of the cured film 307 having a pattern shape and the mold 305 in the releasing step. Thus, a reducing effect on a release force serving as a force required to release the cured film 307 having a pattern shape and the mold 305 tends to be exhibited.

A method for releasing the cured film 307 having a pattern shape and the mold 305 from each other is not particularly limited as long as part of the cured film 307 having a pattern shape is not physically damaged at the time of the release, and various conditions and the like are also not particularly limited. For example, the following may be performed: the substrate 301 (substrate to be processed) is fixed and the mold 305 is peeled by being moved so as to recede from the substrate 301. Alternatively, the following may be performed: the mold 305 is fixed and the substrate 301 is peeled by being moved so as to recede from the mold 305. Alternatively, both the substrate and the mold may be peeled from each other by being pulled in directions diametrically opposite to each other.

Through the foregoing series of steps (manufacturing process) including the first step to the fifth step, the cured film 307 having a desired groove/land pattern shape (pattern shape associated with the groove/land shape of the mold 305) at a desired position can be obtained. The resultant cured film 307 having a pattern shape can be utilized as, for example, an optical member (including the case where the cured film is utilized as one member of the optical member), such as a Fresnel lens or a diffraction grating, in addition to a semiconductor processing application to be described later. In such case, an optical member including at least the substrate 301 and the cured film 307 that is arranged on the substrate 301 and has a pattern shape can be obtained.

In the method for manufacturing a film having a pattern shape of the present invention, the following can be performed: the curable composition (α1) 302 is collectively arranged on most of the surface of the substrate 301 in the first step, and a repeating unit (shot) formed of the second step to the fifth step is repeatedly performed on the same substrate a plurality of times. In addition, the first step to the fifth step may be repeatedly performed on the same substrate a plurality of times. When the first step to the fifth step are, or the repeating unit (shot) formed of the second step to the fifth step is, repeated a plurality of times, a cured film having a plurality of desired groove/land pattern shapes (pattern shapes associated with the groove/land shape of the mold 305) at desired positions of the substrate 301 (substrate to be processed) can be obtained.

<Residual Film Removing Step of removing Part of Cured Film (Sixth Step)>

Figure 4:
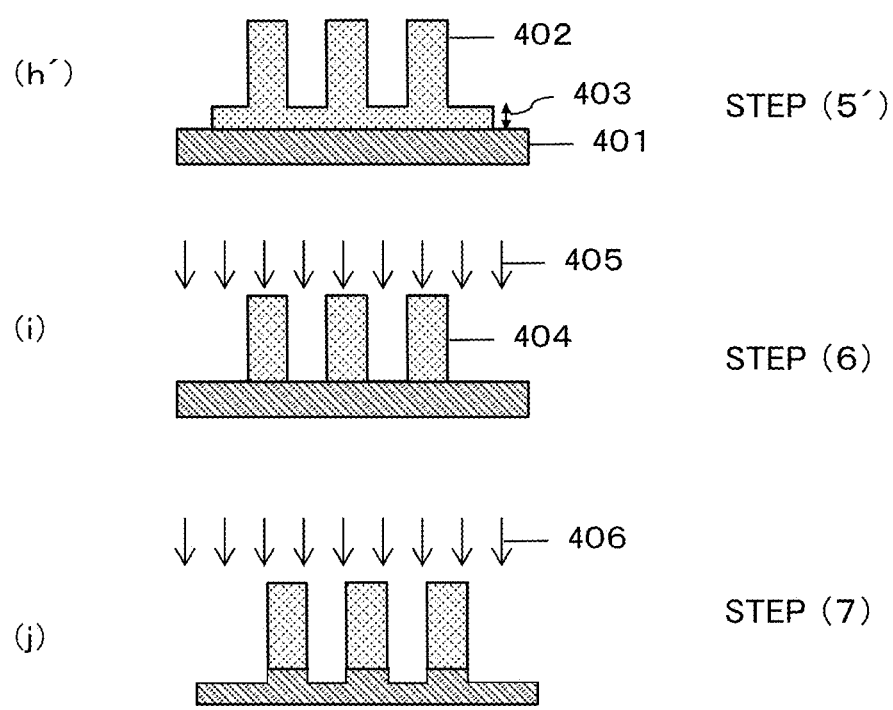
FIG. 4 is schematic sectional view for illustrating a residual film removing step in one embodiment of the present invention.

Although the cured film 402 (corresponding to cured film 307 in FIG. 3) having a pattern shape obtained by the releasing step has a specific pattern shape, as illustrated in FIG. 4(h'), part of the cured film may remain also in an area except an area where the pattern shape is formed (such part of the cured film is hereinafter referred to as "residual film 403"). In such case, as illustrated in FIG. 4(i), the cured film (residual film 403) in an area to be removed out of the resultant cured film 402 having a pattern shape is removed with an etching gas A 405 (FIG. 4(i)) or the like. Thus, a pattern of a cured product 404 that has a desired groove/land pattern shape (pattern shape associated with the groove/land shape of the mold 305 of FIG. 3) and is free of any residual film (a desired portion of the surface of a substrate 401 is exposed) can be obtained.

Here, a method for removing the residual film 403 is, for example, a method involving removing the cured film (residual film 403) serving as a groove portion of the cured film 402 having a pattern shape by a method such as etching to expose the surface of the substrate 401 in the groove portion of a pattern of the cured film 402 having a pattern shape.

When the residual film 403 in a groove portion of the cured film 402 having a pattern shape is removed by etching, a specific method for the removal is not particularly limited, and a conventionally known method, such as dry etching involving using the etching gas A 405 (FIG. 4(i)), can be used. A conventionally known dry etching apparatus can be used in the dry etching. In addition, the etching gas A 405 is appropriately selected in accordance with the elemental composition of the cured film to be subjected to the etching, and a halogen-based gas, such as $CF_4$, $C_2F_6$, $C_3F_8$, $CCl_2F_2$, $CCl_4$, $CBrF_3$, $BCl_3$, $PCl_3$, $SF_6$, or $Cl_2$, an oxygen atom-containing gas, such as $O_2$, CO, or $CO_2$, an inert gas, such as He, $N_2$, or Ar, a $H_2$ or $NH_3$ gas, or the like can be used. Those gases can be used as a mixture.

When the substrate 401 (substrate to be processed) to be used is a substrate improved in adhesiveness with the cured film 402 having a pattern shape by a surface treatment, such as a silane coupling treatment, a silazane treatment, or the formation of an organic thin film, the surface-treated layer can also be removed by etching subsequently to the etching of the cured film (residual film 403) in a groove portion of the cured film 402 having a pattern shape.

Through the foregoing manufacturing process including the first step to the sixth step, the pattern of a cured product 404 that has a desired groove/land pattern shape (pattern shape associated with the groove/land shape of the mold 305) at a desired position and is free of any residual film can be obtained, and hence an article having the pattern of a cured product can be obtained. Further, when the substrate 401 is processed by utilizing the resultant pattern of a cured product 404 free of any residual film, a substrate processing step to be described later is performed on the substrate 401.

Meanwhile, in addition to the semiconductor processing application to be described later, the resultant pattern of a cured product 404 free of any residual film can be utilized as, for example, an optical member (including the case where the pattern is utilized as one member of the optical member), such as a diffraction grating or a polarizing plate, to provide an optical component. In such case, an optical component including at least the substrate 401 and the pattern of a cured product 404 that is arranged on the substrate 401 and is free of any residual film can be obtained.

<Substrate Processing Step (Seventh Step)>

After the residual film removing step, part of the substrate 401 where its surface has been exposed in the sixth step is subjected to dry etching by utilizing the pattern of a cured product 404 free of any residual film as a resist film. A conventionally known dry etching apparatus can be used in the dry etching. In addition, an etching gas B 406 (FIG. 4(j)) is appropriately selected in accordance with the elemental composition of the cured film to be subjected to the etching and the elemental composition of the substrate 401, and a halogen-based gas, such as $CF_4$, $C_2F_6$, $C_3F_8$, $CCl_2F_2$, $CCl_4$, $CBrF_3$, $BCl_3$, $PCl_3$, $SF_6$, or $Cl_2$, an oxygen atom-containing gas, such as $O_2$, CO, or $CO_2$, an inert gas, such as He, $N_2$, or Ar, a $H_2$ or $NH_3$ gas, or the like can be used. Those gases can be used as a mixture. The etching gas A 405 (FIG. 4(i)) and the etching gas B 406 (FIG. 4(j)) may be identical to or different from each other.

A circuit structure based on a pattern shape associated with the groove/land shape of the mold 305 can be formed on the substrate 401 through the formation of an electronic component in addition to the foregoing series of steps (manufacturing process) including the first step to the seventh step. Thus, a circuit board to be utilized in a semiconductor device or the like can be manufactured. The term "semiconductor device" as used herein refers to, for example, a LSI, a system LSI, a DRAM, a SDRAM, a RDRAM, a D-RDRAM, or a NAND flash. In addition, an electronic device, such as a display, a camera, or a medical instrument, can be formed by connecting the circuit board to, for example, a circuit control mechanism for the circuit board.

In addition, an optical component can be similarly obtained by processing the substrate 401 through dry etching involving utilizing the cured product pattern 404 free of any residual film as a resist film.

In addition, a replica of a quartz imprint mold (quartz replica mold) can be produced by: using a quartz substrate as the substrate 401; and processing the quartz through dry etching involving utilizing the cured product pattern 404 free of any residual film as a resist film.

When a substrate with a circuit or an electronic component is produced, the cured product pattern 404 free of any residual film may be finally removed from the processed substrate 401, or a construction in which the pattern is left as a member constituting a device may be adopted.

<Material for Imprint Pretreatment and Cured Product Thereof>

Another embodiment of the present invention is a coating material for imprint pretreatment including the above-mentioned curable composition (α1). The coating material for imprint pretreatment of the present invention is suitably consisted of the above-mentioned curable composition (α1).

In other word, the coating material for imprint pretreatment of the present invention is a coating material for imprint pretreatment consisting of the curable composition (α1) containing at least a component (A1) serving as a polymerizable compound, in which: when a liquid film serving as an imprint pretreatment coating is formed on a substrate and a liquid droplet formed of a curable composition (α2) containing at least a component (A2) serving as a polymerizable compound is dispensed to the liquid film, spread of a component of the liquid droplet in a substrate surface direction is accelerated; and in the curable composition (α1), mixing of a composition (α1') of components of the curable composition (α1) except a component (D 1) serving as a solvent and the curable composition (α2) dispensed in the second step is exothermic.

EXAMPLES

The present invention is hereinafter described in more detail by way of Examples, but the technical scope of the present invention is not limited to Examples to be described below.

Example 1

(1) Preparation of Curable Composition (α1-1)

A component (A1), a component (B1), a component (C1), and a component (D1) described below were blended, and the blend was filtered with a 0.2-micrometer filter made of ultrahigh-molecular weight polyethylene to prepare a curable composition (α1-1) of Example 1.

(1-1) Component (A1):100 parts by weight in total
<A1-1> 1,12-Dodecanediol diacrylate (manufactured by Wanda Science): 100 parts by weight
(1-2) Component (B1): 0 parts by weight in total
The component (B1) was not added.
(1-3) Component (C1): 0 parts by weight in total
The component (C1) was not added.
(1-4) Component (D1): 33,000 parts by weight in total
<D1-1> Propylene glycol monomethyl ether acetate (manufactured by Tokyo Chemical Industry Co., Ltd., abbreviation: PGMEA): 33,000 parts by weight

Example 2

(1) Preparation of Curable Composition (α1-2)

A curable composition (α1-2) was prepared in the same manner as in Example 1 except that the component (A1) was changed to 30 parts by weight of <A1-1> 1,12-dodecanediol diacrylate (manufactured by Wanda Science) and 70 parts by weight of <A1-2> dimethyloltricyclodecane diacrylate (manufactured by Sartomer, trade name: SR833s).

Example 3

(1) Preparation of Curable Composition (α1-3)

A curable composition (α1-3) was prepared in the same manner as in Example 1 except that the component (A1) was changed to 100 parts by weight of <A1-3> polyethylene glycol #200 diacrylate (manufactured by Shin-Nakamura Chemical Co., Ltd., trade name: A-200).

Example 4

(1) Preparation of Curable Composition (α1-4)

A curable composition (α1-4) was prepared in the same manner as in Example 1 except that the component (A) was changed to 30 parts by weight of <A1-1> 1,12-dodecanediol diacrylate (manufactured by Wanda Science) and 70 parts by weight of <A1-3> polyethylene glycol #200 diacrylate (manufactured by Shin-Nakamura Chemical Co., Ltd., trade name: A-200).

Example 5

(1) Preparation of Curable Composition (α2-1)

A component (A2), a component (B2), a component (C2), and a component (D2) described below were blended, and the blend was filtered with a 0.2-micrometer filter made of ultrahigh-molecular weight polyethylene to prepare a curable composition (α2-1) of Example 6.

(1-1) Component (A2): 94 parts by weight in total
<A2-1> Isobornyl acrylate (manufactured by Kyoeisha Chemical Co., Ltd., trade name: IB-XA): 9.0 parts by weight
<A2-2> Benzyl acrylate (manufactured by Osaka Organic Chemical Industry Ltd., trade name: V#160): 38.0 parts by weight
<A2-3> Neopentyl glycol diacrylate (manufactured by Kyoeisha Chemical Co., Ltd., trade name: NP-A): 47.0 parts by weight
(1-2) Component (B2): 3 parts by weight in total
<B2-1> Lucirin TPO (manufactured by BASF): 3 parts by weight
(1-3) Component (C2): 2.1 parts by weight in total
<C2-1> SR-730 (manufactured by Aoki Oil Industrial Co., Ltd.): 1.6 parts by weight
<C2-2> 4,4'-Bis(diethylamino)benzophenone (manufactured by Tokyo Chemical Industry Co., Ltd.): 0.5 part by weight
(1-4) Component (D2): 0 parts by weight in total
The component (D2) was not added.

Example 6

(1) Preparation of Curable Composition (α2-2)

A component (A2), a component (B2), a component (C2), and a component (D2) described below were blended, and the blend was filtered with a 0.2-micrometer filter made of ultrahigh-molecular weight polyethylene to prepare a curable composition (α2-2) of Example 6.

(1-1) Component (A2):94 parts by weight in total
<A2-1> Isobornyl acrylate (manufactured by Kyoeisha Chemical Co., Ltd., trade name: IB-XA): 9.0 parts by weight
<A2-2> Benzyl acrylate (manufactured by Osaka Organic Chemical Industry Ltd., trade name: V#160): 38.0 parts by weight
<A2-3> Neopentyl glycol diacrylate (manufactured by Kyoeisha Chemical Co., Ltd., trade name: NP-A): 47.0 parts by weight
(1-2) Component (B2): 0 parts by weight in total
The component (B2) was not added.
(1-3) Component (C2): 0 parts by weight in total
The component (C2) was not added.
(1-4) Component (D2): 0 parts by weight in total
The component (D2) was not added.

<Measurement of Surface Tension of Each of Composition (α1') of Components of Curable Composition (α1) except Component (D1) Serving as a Solvent and Curable Composition (α2)>

The measurement of the surface tension of each of the composition (α1') of the components of the curable composition (α1) except the component (D1) serving as a solvent and the curable composition (α2) was performed by measuring a surface tension at 25° C. with an automatic surface tensiometer DY-300 (manufactured by Kyowa Interface Science Co., Ltd.) by a plate method involving using a platinum plate. The measurement was performed under the conditions of a number of times of the measurement of 5 and a pre-wet immersion distance of the platinum plate of 0.35 mm. The first measured value was excluded, and the average of the second to fifth measured values was defined as the surface tension. The results of measurement of the surface tension of the curable composition prepared in Examples 1 to 6 are shown in Table 1. With respect to the curable composition (α1) of Examples 1 to 4, the surface tension of the composition (α1') of the components of the curable composition (α1) except the component (D) serving as a solvent are shown in table 1.

TABLE 1

| | Curable Composition (α) | Composition (α1') | Surface Tension (mN/m) |
|---|---|---|---|
| Example 1 | α1-1 | α1'-1 | 34 |
| Example 2 | α1-2 | α1'-2 | 37 |
| Example 3 | α1-3 | α1'-3 | 40 |
| Example 4 | α1-4 | α1'-4 | 38 |
| Example 5 | α2-1 | — | 33 |
| Example 6 | α2-2 | — | 33 |

<Photo-Nanoimprint Process Using Curable composition (α1) and Curable Composition (α2)>

Example 7

The curable composition (α1-1) was applied onto a silicon substrate having a diameter of 450 nm with a spin coater. At this time, the component (D1) serving as a solvent in the curable composition (α1-1) was volatilized, and a film of a composition (α1'-1) of the components of the curable composition (α1-1) except the component (D1) serving as a solvent having a thickness of from about 7 nm was obtained.

One-picoliter droplets of the curable composition (α2-1) can be arranged discretely on the film of the curable composition (α1'-1) by using an inkjet method. A droplet amount was set to an amount that the average thickness of a cured film of the mixture of the curable composition (α1'-1) and the curable composition (α2-1) becomes about 37 nm. At this time, the surface tension of the curable composition (α1'-1) arranged in the lower layer was higher than the surface tension of the curable composition (α2-1) dispensed dropwise to form the upper layer, and hence the Marangoni effect was expressed and the expansion (prespread) of the droplets of the curable composition (α2-1) was quick.

In addition, when the curable composition (α2-1) was added to and mixed with the composition (α1'-1) of the components of the curable composition (α1-1) except the component (D1) serving as a solvent at 1:1 (weight ratio), the curable composition (α2-1) and the composition (α1'-1) were exothermically mixed.

A measurement of the surface tensions of the composition (α1') of the curable composition (α1) of components except the component (D1) serving as a solvent and the curable composition (α2) and a measurement of the presence or absence of heat generation at the time of the mixing of the composition (α1') of the curable composition (α1) of components except the component (D1) serving as a solvent and the curable composition (α2) are measured as described above.

Example 8

Expansion of the droplets was observed and the heat generation at the time of mixing of the curable compositions was measured in the same manner as in Example 7 except that the curable composition (α1-1) was changed to the curable composition (α1-2).

The surface tension of composition (α1'-2) of the components of the curable composition (α1-2) except the component (D1) serving as a solvent arranged in the lower layer was higher than the surface tension of the curable composition (α2-1) dispensed dropwise to form the upper layer, and hence the Marangoni effect was expressed and the expansion (prespread) of the droplets of the curable composition (α2-1) was quick.

In addition, when the curable composition (α2-1) was added to and mixed with the composition (α1'-2) of the components of the curable composition (α1-2) except the component (D1) serving as a solvent at 1:1 (weight ratio), the curable composition (α2-1) and the composition (α1'-2) were exothermically mixed.

Example 9

Expansion of the droplets was observed and the heat generation at the time of mixing of the curable compositions was measured in the same manner as in Example 7 except that the curable composition (α1-1) was changed to the curable composition (α1-3).

The surface tension of composition (α1'-3) of the components of the curable composition (α1-3) except the component (D1) serving as a solvent arranged in the lower layer was higher than the surface tension of the curable composition (α2-1) dispensed dropwise to form the upper layer, and hence the Marangoni effect was expressed and the expansion (prespread) of the droplets of the curable composition (α2-1) was quick.

In addition, when the curable composition (α2-1) was added to and mixed with the composition (α1'-3) of the components of the curable composition (α1-3) except the component (D1) serving as a solvent at 1:1 (weight ratio), the curable composition (α2-1) and the composition (α1'-3) were exothermically mixed.

Example 10

Expansion of the droplets was observed and the heat generation at the time of mixing of the curable compositions was measured in the same manner as in Example 7 except that the curable composition (α1-1) was changed to the curable composition (α1-4).

The surface tension of composition (α1'-4) of the components of the curable composition (α1-4) except the component (D1) serving as a solvent arranged in the lower layer was higher than the surface tension of the curable composition (α2-1) dispensed dropwise to form the upper layer, and hence the Marangoni effect was expressed and the expansion (prespread) of the droplets of the curable composition (α2-1) was quick.

In addition, when the curable composition (α2-1) was added to and mixed with the composition (α1'-4) of the components of the curable composition (α1-4) except the component (D1) serving as a solvent at 1:1 (weight ratio), the curable composition (α2-1) and the composition (α1'-4) were exothermically mixed.

Comparative Example 1

Expansion of the droplets was observed and the heat generation at the time of mixing of the curable compositions was measured in the same manner as in Example 9 except that the curable composition (α2-1) was changed to the curable composition (α2-2).

The surface tension of composition (α1'-3) of the components of the curable composition (α1-3) except the component (D1) serving as a solvent arranged in the lower layer was higher than the surface tension of the curable composition (α2-2) dispensed dropwise to form the upper layer, and hence the Marangoni effect was expressed and the expansion (prespread) of the droplets of the curable composition (α2-2) was quick.

In addition, when the curable composition (α2-2) was added to and mixed with the composition (α1'-3) of the components of the curable composition (α1-3) except the component (D1) serving as a solvent at 1:1 (weight ratio), the curable composition (α2-2) and the composition (α1'-3) were not exothermically mixed.

<Measurement of Presence or Absence of Heat Generation at Time of Mixing of Composition (α1') of Components of Curable Composition (α1) except Component (D1) Serving as Solvent and Curable Composition (α2)>

When the curable composition (α2) was added to and mixed with the composition (α1') of the components of the curable composition (α1) except the component (D1) serving as a solvent at 1:1 (weight ratio) as shown in each of above-mentioned Examples, the heat generation quantity or the heat absorption quantity at the mixing in the each Examples was measured with a differential scanning calorimeter (DSC) i.e. the presence or absence of heat generation at the time of the mixing was judged. The evaluations were performed under an environment at room temperature. The results are shown in Table 2.

TABLE 2

| | Curable Compositions (α) | Difference between surface tensions of compositions (α1'-α2) (mN/m) | Presence or Absence of heat generation |
|---|---|---|---|
| Example 7 | α1'-1/α2-1 | 1 | Presence |
| Example 8 | α1'-2/α2-1 | 4 | Presence |
| Example 9 | α1'-3/α2-1 | 7 | Presence |
| Example 10 | α1'-4/α2-1 | 5 | Presence |
| Comparative Example 1 | α1'-3/α2-2 | 5 | Absence |

When the composition (α1') of the components of the curable composition (α1) except the component (D1) serving as a solvent and the curable composition (α2) whose mixing is exothermic as described above are used, an increase in viscosity resulting from a reduction in temperature when the curable composition (α2) is dispensed dropwise and mixed onto the composition (α1') of the components of the curable composition (α1) except the component (D1) serving as a solvent is prevented, and hence the mixing of the composition (α1') and the curable composition (α2) can be accelerated. Namely, the liquid film of the mixture 308 of the composition (α1') and the curable composition (α2) having uniform physical properties in a shot area of the substrate can be obtained in a shorter time period (FIG. 3(e)). Thus, a pattern having uniform physical properties in the shot area of the substrate can be formed at high throughput.

According to the present invention, it is possible to provide the method for fabricating pattern of a cured product having uniform physical properties in a shot area of a substrate at high throughput.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for fabricating pattern of a cured product, comprising:
    arranging a layer formed of a liquid film of a curable composition (α1) containing at least a component (A1) serving as a polymerizable compound on a substrate;
    dispensing liquid droplets of a curable composition (α2) containing at least a component (A2) serving as a polymerizable compound discretely onto a layer formed of a liquid film of a composition (α1') of components of the curable composition (α1) except a component (D1) serving as a solvent;
    bringing a mixture layer obtained by mixing the composition (α1') and the curable composition (α2) into contact with a mold;
    irradiating the mixture layer with light from a side of the mold to cure the layer; and
    releasing the mold from the mixture layer after the curing, wherein mixing of the composition (α1') and the curable composition (α2) is exothermic.

2. The method according to claim 1, wherein a surface tension of the composition (α1') is larger than a surface tension of the curable composition (α2).

3. The method according to claim 1, wherein the substrate has an adhesion layer formed on a surface where the layer formed of the liquid film of the curable composition (α1) is arranged.

4. The method according to claim 1, wherein:
    the mold comprises a mold having a groove/land pattern formed on a surface thereof;
    a groove portion of the groove/land pattern has a width of 4 nm to less than 30 nm; and
    the groove portion of the groove/land pattern has an aspect ratio from 1 to 10.

5. The method according to claim 1, further comprising performing an alignment of the substrate and the mold between the dispensing and the bringing of the mixture layer into contact with the mold.

6. The method according to claim 1, wherein the dispensing to the releasing are repeated in different areas on the substrate a plurality of times.

7. The method according to claim 1, wherein the bringing of the mixture layer into contact with the mold is performed under an atmosphere containing a condensable gas.

8. A method for manufacturing an optical component, comprising the method of claim 1.

9. A method for manufacturing a circuit board, comprising the method of claim 1.

10. A method for manufacturing a quartz mold replica, comprising the method of claim 1.

11. The method for manufacturing according to claim 9, wherein the circuit board is a semiconductor device.

12. A pattern forming method, comprising:
    dispensing a droplet of a resist discretely onto a liquid film of an imprint pretreatment coating on a substrate such that the droplet of the resist spreads on the liquid film of the imprint pretreatment coating to yield a spread resist, wherein the imprint pretreatment coating comprises a curable composition and the resist comprises a polymerizable compound;
    contacting the spread resist with a mold; and polymerizing the spread resist and the imprint pretreatment coating to yield a cured layer on the substrate;

wherein mixing of the imprint pretreatment coating and the resist is exothermic.

13. A method for manufacturing a semiconductor device, the method comprising:

providing a liquid film of an imprint pretreatment coating on a substrate, wherein the imprint pretreatment coating comprises a polymerizable compound;

dispensing a droplet of a resist onto the liquid film of the imprint pretreatment coating such that the droplet of the resist spreads on the liquid film of the imprint pretreatment coating to yield a spread resist, wherein the resist comprises a polymerizable compound;

contacting the spread resist with a mold;

polymerizing the spread resist and the imprint pretreatment coating to yield a cured layer on the substrate;

releasing the mold from the cured layer; and etching the substrate via the cured layer;

wherein mixing of the imprint pretreatment coating and the resist is exothermic.

14. The method according to claim 13, wherein:

the providing of the liquid film of the imprint pretreatment coating comprises coating the substrate using an inkjet method, dip coating, air knife coating, curtain coating, wire bar coating, gravure coating, extrusion coating, spin coating, or a slit scan method, and dispensing the droplet of the resist onto the liquid film of the imprint pretreatment coating using an ink jet method.

15. The method according to claim 1, wherein the dispensing is such that the liquid droplets are spread on the liquid film.

* * * * *